(12) United States Patent
Kang et al.

(10) Patent No.: US 11,997,803 B2
(45) Date of Patent: May 28, 2024

(54) ROLLABLE ELECTRONIC DEVICE INCLUDING FLEXIBLE DISPLAY

(71) Applicant: Samsung Electronics Co., Ltd., Suwon-si (KR)

(72) Inventors: Hyunggwang Kang, Suwon-si (KR); Hojin Jung, Suwon-si (KR); Baekeun Cho, Suwon-si (KR); Hyoungtak Cho, Suwon-si (KR); Junhyuk Kim, Suwon-si (KR); Hoyoung Jeong, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 293 days.

(21) Appl. No.: 17/520,358

(22) Filed: Nov. 5, 2021

(65) Prior Publication Data
US 2022/0151091 A1 May 12, 2022

Related U.S. Application Data

(63) Continuation of application No. PCT/KR2021/016070, filed on Nov. 5, 2021.

(30) Foreign Application Priority Data

Nov. 6, 2020 (KR) .................. 10-2020-0147753
Feb. 10, 2021 (KR) .................. 10-2021-0019279

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
CPC ........................ H05K 5/0217; H05K 5/0017
(Continued)

(56) References Cited

U.S. PATENT DOCUMENTS 8,199,471 B2 * 6/2012 Bemelmans .............. G09F 9/00
455/462
8,493,726 B2 * 7/2013 Visser ..................... G09F 9/301
361/679.05

(Continued)

FOREIGN PATENT DOCUMENTS

JP H06-276901 A 10/1994
KR 10-2014-0024145 A 2/2014
(Continued)

OTHER PUBLICATIONS

International Search Report dated Feb. 10, 2022, issued in International Application No. PCT/KR2021/016070.
(Continued)

*Primary Examiner* — Hung S. Bui
(74) *Attorney, Agent, or Firm* — Jefferson IP Law, LLP

(57) ABSTRACT

The disclosure relates to an electronic device including a rollable display is provided. The electronic device includes a housing including a first surface oriented in a first direction, a second surface oriented in a second direction opposite to the first direction, a first side member slidable in a third direction different from the first direction and the second direction, and a second side member facing away from the first side member, a flexible display including a first region oriented in the first direction and a second region extending from the first region and oriented in the second direction opposite to the first direction, a plate configured to support at least a portion of the flexible display and to perform a sliding movement to cause at least a portion of the second region to be oriented in the first direction so as to substantially enable expansion of the first region, at least one (Continued)

member configured to enable the sliding movement of the plate through a rotational motion, and a rotation detection sensor configured to detect a degree of rotation while the at least one member rotates about a rotating axis.

13 Claims, 17 Drawing Sheets

(58) Field of Classification Search
USPC .......................................................... 361/807
See application file for complete search history.

(56) References Cited

U.S. PATENT DOCUMENTS

| | | |
|---|---|---|
| 2014/0049464 A1 | 2/2014 | Kwak et al. |
| 2014/0380186 A1 | 12/2014 | Kim et al. |
| 2016/0353588 A1 | 12/2016 | Kim et al. |
| 2016/0374228 A1* | 12/2016 | Park .......................... G09F 9/301 |
| 2017/0147189 A1 | 5/2017 | Ryu et al. |
| 2017/0278436 A1 | 9/2017 | Chu |
| 2017/0318689 A1* | 11/2017 | Kim ...................... H05K 5/0017 |
| 2018/0014417 A1 | 1/2018 | Seo et al. |
| 2018/0198899 A1 | 7/2018 | Lee |
| 2019/0146558 A1 | 5/2019 | Ohata et al. |
| 2020/0170114 A1* | 5/2020 | Choi ...................... H05K 5/0217 |
| 2020/0253069 A1* | 8/2020 | Cha ........................ G06F 1/1681 |
| 2020/0363841 A1 | 11/2020 | Kim et al. |
| 2020/0365063 A1 | 11/2020 | Park et al. |
| 2022/0201108 A1 | 6/2022 | Kim |
| 2022/0303373 A1 | 9/2022 | Kang et al. |

FOREIGN PATENT DOCUMENTS

| | | |
|---|---|---|
| KR | 10-2014-0147497 A | 12/2014 |
| KR | 10-2016-0140036 A | 12/2016 |
| KR | 10-2017-0060519 A | 6/2017 |
| KR | 10-2018-0000723 A | 1/2018 |
| KR | 10-2018-0006533 A | 1/2018 |
| KR | 10-2019-0062855 A | 6/2019 |
| KR | 10-2296866 B1 | 9/2021 |
| KR | 10-2021-0133209 A | 11/2021 |
| KR | 10-2022-0044561 A | 4/2022 |
| KR | 10-2022-0053281 A | 4/2022 |
| WO | 2014/080176 A1 | 5/2014 |
| WO | WO2017-208552 A1 | 3/2019 |

OTHER PUBLICATIONS

Extended European Search Report dated Dec. 18, 2023, issued in European Patent Application No. 21889636.3.

* cited by examiner

ROLLABLE ELECTRONIC DEVICE INCLUDING FLEXIBLE DISPLAY

CROSS-REFERENCE TO RELATED APPLICATIONS

This application is a continuation application, claiming priority under § 365(c), of an International application No. PCT/KR2021/016070, filed on Nov. 5, 2021, which is based on and claims the benefit of a Korean patent application number 10-2020-0147753, filed on Nov. 6, 2020, in the Korean Intellectual Property Office, and of a Korean patent application number 10-2021-0019279, filed on Feb. 10, 2021, in the Korean Intellectual Property Office, the disclosure of each of which is incorporated by reference herein in its entirety.

BACKGROUND

1. Field

The disclosure relates to a rollable electronic device. More particularly, the disclosure relates to a rollable electronic device including a flexible display.

2. Description of Related Art

As the demand for mobile communication increases while the degree of integration of electronic devices increases, portability of electronic devices, such as mobile communication terminals can be improved, and convenience can be improved in use of multimedia functions and the like. For example, by replacing a traditional mechanical (button-type) keypad with a display in which a touch screen function is integrated, an electronic device can be miniaturized while maintaining the function of the input device thereof. For example, when a mechanical keypad is removed from an electronic device, the portability of the electronic device can be improved. In another embodiment of the disclosure, when a display is expanded by the region in which the mechanical keypad is removed, an electronic device including a touch screen function can provide a larger screen compared to an electronic device including the mechanical keypad, even when the electronic device including the touch screen function has the same size and weight as the electronic device including the mechanical keypad.

In using a web surfing or multimedia function, it may be more convenient to use an electronic device that outputs a larger screen. A larger display may be mounted on an electronic device in order to output a larger screen. However, considering the portability of the electronic device, there may be restrictions in increasing the size of the display. In an embodiment of the disclosure, a display using an organic light-emitting diode or the like may make it possible to ensure portability of an electronic device while providing a larger screen. For example, a display using an organic light-emitting diode (or an electronic device equipped with the display) may make it possible to implement a stable operation even if it is made very thin so that the display can be mounted on an electronic device in a foldable, bendable, or rollable form.

The above information is presented as background information only to assist with an understanding of the disclosure. No determination has been made, and no assertion is made, as to whether any of the above might be applicable as prior art with regard to the disclosure.

SUMMARY

In an electronic device including a rollable display (hereinafter, referred to as a "rollable electronic device"), depending on the expanded or contracted length (or region) of the display, a user interface (UI) or current consumption may be changed, and a touch recognition range may also be changed. The rollable electronic device may measure the expanded or contracted length of the display due to the rolling of the display. Through this, the rollable electronic device may output a screen corresponding to the expanded or contracted display. Therefore, in the rollable electronic device, it may be very important to accurately estimate the length (or movement distance) of the display according to the expansion or contraction of the display.

According to an embodiment of the disclosure, when the display is automatically expanded by driving a motor, the position of the display may be estimated based on the number of rotations of the motor. According to another embodiment of the disclosure, it is possible to apply a method of estimating the relative position to which the display is moved based on the position of a plate (e.g., a multi-bar plate) provided at the lower end of the display when the display is expanded or contracted. According to another embodiment of the disclosure, it is also possible to apply a method of estimating the movement distance of the display by mounting a magnet on a display expansion part and measuring a magnetic field generated from the magnet using a sensor. In addition, according to an embodiment of the disclosure, it is also possible to apply a method of measuring the distance between the basic position of the display and the position in the state in which the display is in the expanded or contracted state by calculating the travel time of light using an optical sensor (e.g., a time of flight (ToF) sensor).

Among the above-described embodiments of the disclosure, the method using the number of rotations of the motor may not be available in a device in which a display is expanded or contracted without being equipped with a motor. In addition, the actual number of rotations of the motor may not necessarily match the length by which the display is expanded or contracted in a rollable electronic device. Furthermore, when an error occurs between the actual number of rotations of the motor and the actually expanded or contracted length of the rollable electronic device, the difference between the measured number of rotations and the actual display position will gradually accumulate, resulting in a larger error if the expansion or contraction proceeds without any correction.

Among the above-described embodiments of the disclosure, in the case of the method of estimating the relative position, to which the display is moved, based on the position of the plate provided at the lower end of the display or the method of using a ToF sensor or the like, a "mover" moving a distance corresponding to the linear length by which the display is to be expanded (such as a conduit structure to be measured by a magnet or a ToF sensor moving along the expanded display) may be included. Since it is a method of measuring the amount of change of the "mover", the size of the "mover" may increase as the expanded length of the display increases.

Aspects of the disclosure are to address at least the above-mentioned problems and/or disadvantages and to provide at least the advantages described below. Accordingly, an aspect of the disclosure is to provide a structure capable of accurately measuring an expanded or contracted length of a rollable electronic device.

Another aspect of the disclosure is to provide a sensor that measures the position of a display using a rotation detection sensor and a hinge structure and provides the measured position to a rollable electronic device and a structure on which the sensor is mounted.

Another aspect Another aspect of the disclosure is to provide a method for mounting a sensor using a hinge structure that serves to expand and reduce the display inside the rollable electronic device and to support the expanded display.

Another aspect Another aspect of the disclosure is to provide a structure that measures the length by which the display is expanded or contracted while reducing the interference of an external magnetic field.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first surface oriented in a first direction, a second surface oriented in a second direction opposite to the first direction, a first side member slidable in a third direction different from the first direction and the second direction, and a second side member facing away from the first side member, a flexible display including a first region oriented in the first direction and a second region extending from the first region and oriented in the second direction opposite to the first direction, a plate configured to support at least a portion of the flexible display and to perform a sliding movement to cause at least a portion of the second region to be oriented in the first direction so as to substantially enable expansion of the first region, at least one member configured to enable the sliding movement of the plate through a rotational motion, and a rotation detection sensor configured to detect a degree of rotation while the at least one member rotates about a rotating axis.

In accordance with another aspect of the disclosure, a rollable electronic device is provided. The rollable electronic device includes a processor, a first structure including a first plate configured to provide a first surface oriented in a first direction and a second surface oriented in a second direction opposite to the first surface, a second structure coupled to enclose at least a part of the first structure, and configured to guide a sliding movement of the first structure in a direction parallel to the first surface or the second surface of the first structure, a flexible display including a first region oriented in the first direction and a second region extending from the first region, at least one rotating member disposed inside the housing and configured to rotate according to expansion or contraction of the flexible display, and a rotation detection sensor configured to measure a rotation angle of the at least one rotating member on the rotating axis of the rotating member. The processor is configured to determine the sliding movement distance of the first structure using a change in a detected value measured using the rotation detection sensor on the rotating axis.

According to various embodiments of the disclosure, a rollable electronic device can provide an optimal user experience (UX) to a user by measuring a display position (or a movement distance), and can reduce power consumption and prevent an erroneous touch input operation by deactivating an unused (or unexposed) display region.

According to various implementations, by proposing a method for mounting a sensor using a hinge structure serving as a support for the expansion and contraction of the display inside a rollable electronic device and the support for the expanded display, an additional mounting space can be minimized, which makes it possible for a rollable terminal to maintain a compact design without causing an increase in the thickness or length of the electronic device by a display detection structure (a mover).

According to various embodiments of the disclosure, by proposing a structure that is capable of reducing the interference of an external magnetic field while measuring an expanded or contracted length of a display, it is possible to provide length information of the expanded display to the rollable electronic device even when an external magnetic force is introduced in a detection method using a magnet.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
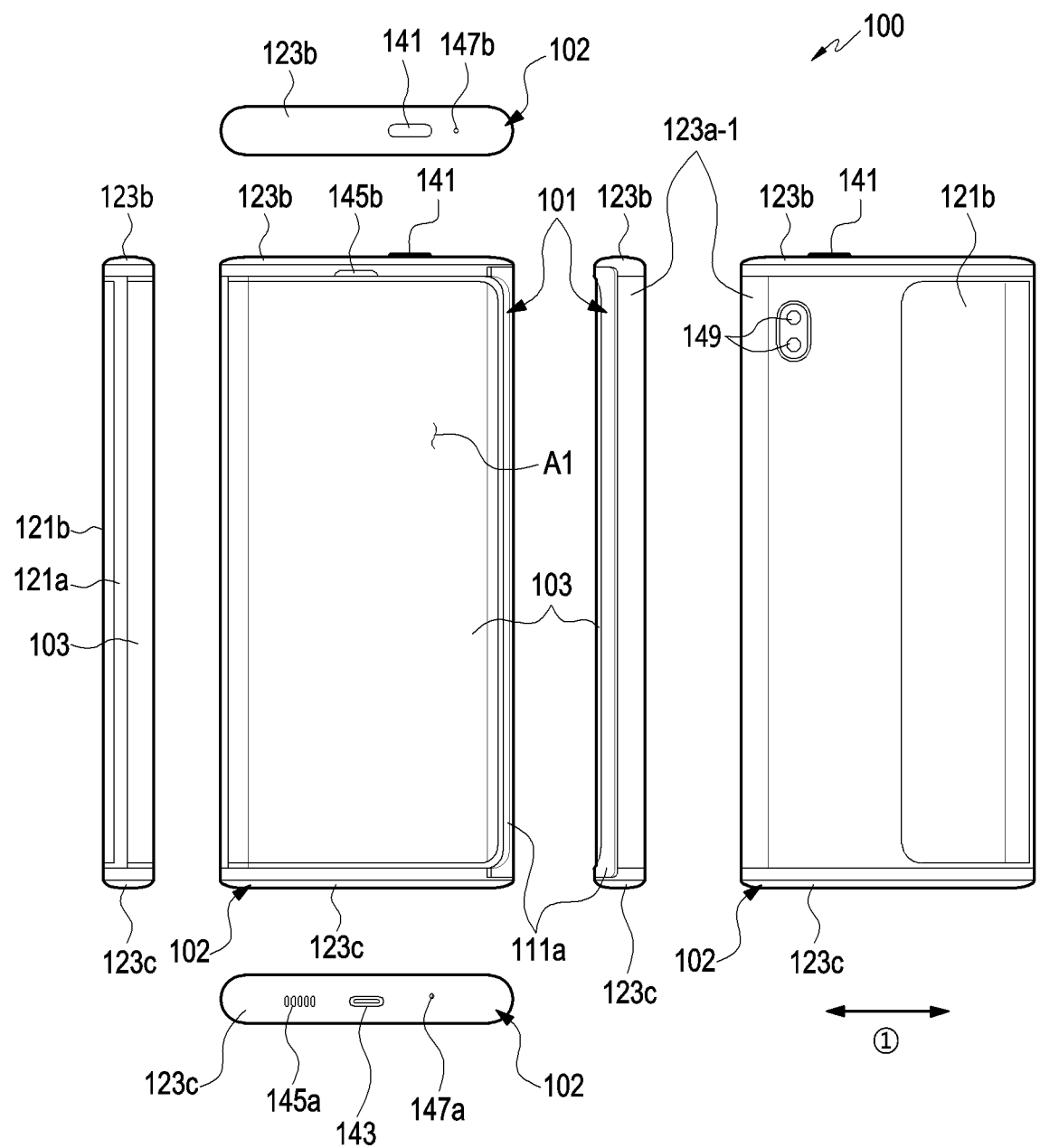
FIG. 1 is a view illustrating an electronic device in a state in which a portion of a flexible display is accommodated in a second structure according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment of the disclosure, the "module" may be implemented in the form of an application-specific integrated circuit (ASIC).

Various embodiments as set forth herein may be implemented as software (e.g., program) including one or more instructions that are stored in a storage medium (e.g., internal memory or external memory) that is readable by a machine (e.g., electronic device). For example, a processor of the machine (e.g., electronic device) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, methods according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each element (e.g., a module or a program) of the above-described elements may include a single entity or multiple entities. According to various embodiments of the disclosure, one or more of the above-described elements may be omitted, or one or more other elements may be added. Alternatively or additionally, a plurality of elements (e.g., modules or programs) may be integrated into a single element. In such a case, according to various embodiments of the disclosure, the integrated element may still perform one or more functions of each of the plurality of elements in the same or similar manner as they are performed by a corresponding one of the plurality of elements before the integration. According to various embodiments of the disclosure, operations performed by the module, the program, or another element may be carried out sequentially, in parallel, repeatedly, or heuristically, or one or more of the operations may be executed in a different order or omitted, or one or more other operations may be added.

Figure 2:
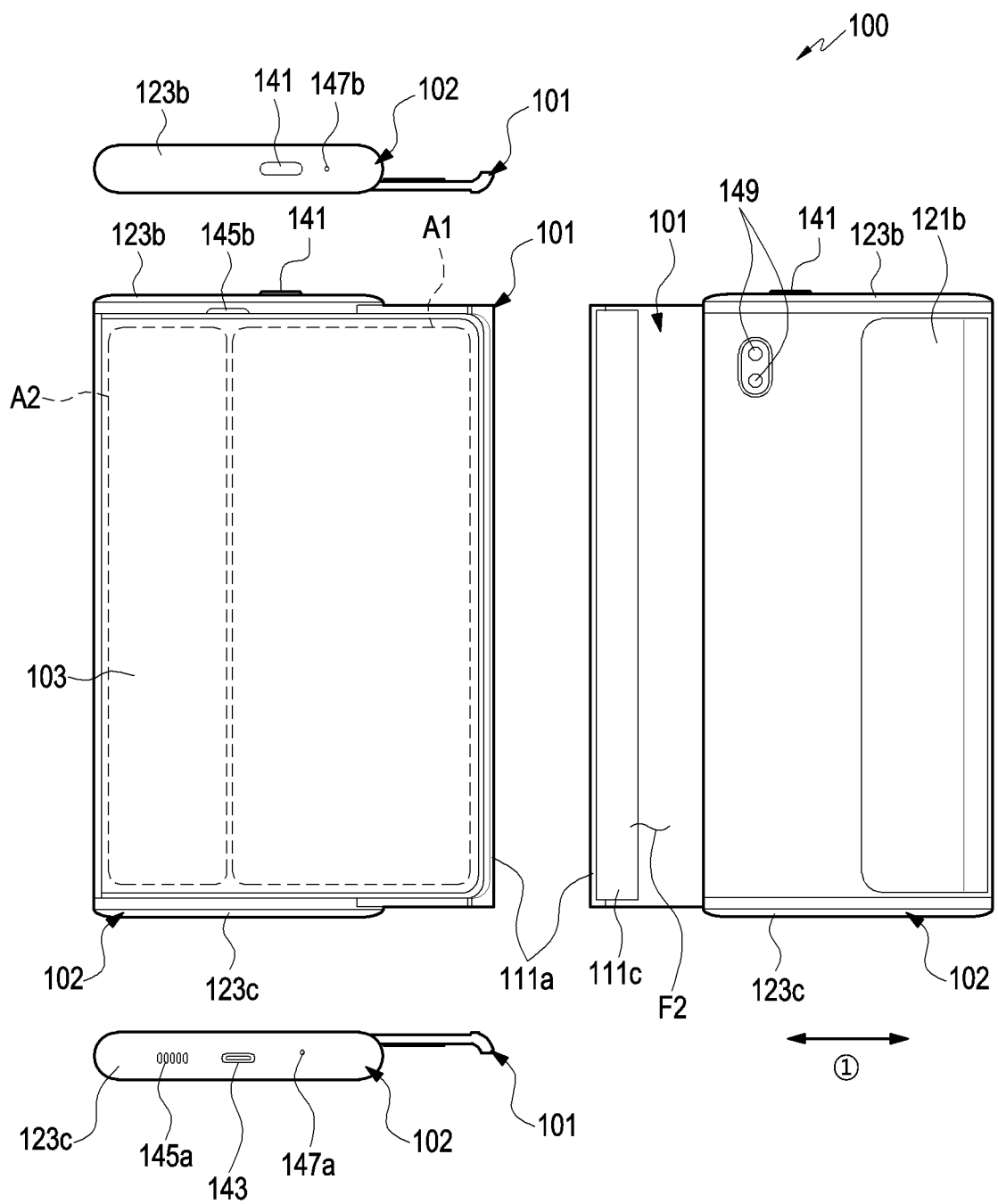
FIG. 2 is a view illustrating an electronic device in the state in which most of a flexible display is exposed to an outside of a second structure according to an embodiment of the disclosure.

FIG. 1 is a view illustrating an electronic device in the state in which a portion (e.g., a second region A2) of a flexible display is accommodated in a second structure 102 according to an embodiment of the disclosure. FIG. 2 is a view illustrating an electronic device in the state in which most of a flexible display is exposed to an outside of the second structure according to an embodiment of the disclosure.

Referring to FIGS. 1 and 2, the state illustrated in FIG. 1 may be defined as the state in which as first structure 101 is closed with respect to a second structure 102, and the state illustrated in FIG. 2 may be defined as the state in which the first structure 101 is open with respect to the second structure 102. According to an embodiment of the disclosure, the "closed state" or the "open state" may be defined as the state in which the electronic device is closed or the state in which the electronic device is open.

Referring to FIGS. 1 and 2, an electronic device 100 may include a first structure 101 and a second structure 102 disposed to be movable on the first structure 101. In some embodiments of the disclosure, the electronic device 100 may be interpreted as a structure in which the first structure 101 is disposed to be slidable on the second structure 102. According to an embodiment of the disclosure, the first structure 101 may be disposed to be reciprocable by a predetermined distance in the illustrated direction (e.g., the direction indicated by arrow ①) relative to the second structure 102.

According to various embodiments of the disclosure, the first structure 101 may be referred to as, for example, a first housing, a slide unit, or a slide housing, and may be disposed to be reciprocable on the second structure 102. In an embodiment of the disclosure, the second structure 102 may be referred to as, for example, a second housing, a main unit, or a main housing, and may accommodate various electrical and electronic components, such as a printed circuit board and a battery. A portion of a display 103 (e.g., the first region A1) may be seated on the first structure 101. In some embodiments of the disclosure, when the first structure 101 moves (e.g., slides) relative to the second structure 102, another portion of the display 103 (e.g., the second region A2) may be accommodated inside the second structure 102 (e.g., a slide-in operation) or exposed to the outside of the second structure 102 (e.g., a slide-out operation). Here, a portion of the display 103 (e.g., the first region A1) may be a basic use region when the display 103 is in the slide-in state, and another portion of the display 103 (e.g., the second region A2) may be an expanded region in the slide-out state. In the embodiment illustrated in FIGS. 1 to 3, an embodiment in which the basic use region of the display 103 in the slide-in state is seated on the first structure 101 is illustrated.

According to various embodiments of the disclosure, the first structure 101 may include a first plate 111a (e.g., a slide plate), and a first surface F1 (see FIG. 3) including at least a portion of the first plate 111a and a second surface F2 facing away from the first surface F1 may be included. According to an embodiment of the disclosure, the second structure 102 may include a second plate 121a (see FIG. 3) (e.g., a rear case), a first side wall 123a extending from the second plate 121a, a second side wall 123b extending from the first side wall 123a and the second plate 121a, a third side wall 123c extending from the first side wall 123a and the second plate 121a and parallel to the second side wall 123b, and/or a rear plate 121b (e.g., a rear window). In some embodiments of the disclosure, the second side wall 123b and the third side wall 123c may be perpendicular to the first side wall 123a. According to an embodiment of the disclosure, the second plate 121a, the first side wall 123a, the second side wall 123b, and the third side wall 123c may be configured to open on one side (e.g., the front surface) to accommodate (or surround) at least a portion of the first structure 101. For example, the first structure 101 is coupled to the second structure 102 in a state of being at least partially surrounded and is slidable in a direction parallel to the first surface F1 or the second surface F2 (e.g., the direction indicated by arrow ①) while being guided by the second structure 102.

According to various embodiments of the disclosure, the second side wall 123b or the third side wall 123c may be omitted. According to an embodiment of the disclosure, the second plate 121a, the first side wall 123a, the second side wall 123b, and/or the third side wall 123c may be configured as separate structures and combined or assembled to each other. The rear plate 121b may be coupled to surround at least a portion of the second plate 121a. In some embodiments of the disclosure, the rear plate 121b may be substantially integrated with the second plate 121a. According to an embodiment of the disclosure, the second plate 121a or the rear plate 121b may cover at least a portion of the flexible display 103. For example, the flexible display 103 may be at least partially accommodated inside the second structure 102, and the second plate 121a or the rear plate 121b may cover a portion of the flexible display 103 accommodated inside the second structure 102.

According to various embodiments of the disclosure, the first structure 101 is movable to an open state or a closed state relative to the second structure 102 in a first direction (e.g., direction ①) parallel to the second plate 121a (e.g., the rear case) and the second side wall 123b so that the first structure 101 is located at a first distance from the first side wall 123a in the closed state and at a second distance, which is greater than the first distance, from the first side wall 123a in the open state. In some embodiments of the disclosure, in the closed state, the first structure 101 may be positioned to surround a portion of the first side wall 123a.

According to various embodiments of the disclosure, the electronic device 100 may include a display 103, a key input device 141, a connector hole 143, audio modules 145a, 145b, 147a, and 147b, or a camera module 149. Although not illustrated, the electronic device 100 may further include an indicator (e.g., a light-emitting diode (LED) device) or various sensor modules.

According to various embodiments of the disclosure, the display 103 may include a first region A1 and a second region A2. In an embodiment of the disclosure, the first region A1 may extend substantially across at least a portion of the first surface F1 to be disposed on the first surface F1. The second region A2 extends from the first region A1 and may be inserted or accommodated into the second structure 102 (e.g., the main housing) according to the sliding movement of the first structure 101, or may be exposed to the outside of the second structure 102. As will be described later, the second region A2 is moved while substantially being guided by a roller 151 (see FIG. 3) mounted on the second structure 102 to be accommodated inside or exposed to the outside of the second structure 102. For example, while the first structure 101 slides, a portion of the second region A2 may be deformed into a curved shape at a position corresponding to the roller 151.

According to various embodiments of the disclosure, when viewed from above the first plate 111a (e.g., the slide plate), if the first structure 101 moves from the closed state to the open state, the second region A2 may define a substantially flat surface with the first region A1 while being gradually exposed to the outside of the second structure 102. The display 103 may be coupled to or disposed adjacent to a touch detection circuit, a pressure sensor capable of measuring touch intensity (pressure), and/or a digitizer configured to detect a magnetic-field-type stylus pen. In an embodiment of the disclosure, the second region A2 may be at least partially accommodated inside the second structure 102, and a portion of the second region A2 may also be exposed to the outside even in the state illustrated in FIG. 1 (e.g., closed state). In some embodiments of the disclosure, irrespective of the closed state or the open state, a portion of the exposed second region A2 may be located on the roller 151, and at a position corresponding to the roller 151, a portion of the second region A2 may maintain a curved shape.

The key input device 141 may be disposed on the second side wall 123b or the third side wall 123c of the second structure 102. The electronic device 100 may be designed such that, depending on the appearance and usage state, the illustrated key input devices 141 are omitted or additional key input device(s) is(are) included. In some embodiment of the disclosure, the electronic device 100 may include a key input device (not illustrated), such as a home key button or a touch pad disposed around the home key button. According to another embodiment of the disclosure, at least some of the key input devices 141 may be located in one region of the first structure 101.

According to various embodiments of the disclosure, the connector hole 143 may be omitted depending on an embodiment of the disclosure, and may accommodate a connector (e.g., a USB connector) for transmitting and receiving power and/or data to and from an external electronic device. Although not illustrated, the electronic device 100 may include a plurality of connector holes 143, and some of the connector holes 143 may function as connector holes for transmitting and receiving audio signals to and from an external electronic device. In the illustrated embodiment of the disclosure, the connector hole 143 is disposed in the third side wall 123c, but the disclosure is not limited thereto. The connector hole 143 or a connector hole (not illustrated) may be disposed in the first side wall 123a or the second side wall 123b.

According to various embodiments of the disclosure, the audio modules 145a, 145b, 147a, and 147b may include speaker holes 145a and 145b or microphone holes 147a and 147b. One of the speaker holes 145a and 145b may be provided as a receiver hole for a voice call, and another one may be provided as an external speaker hole. Each microphone hole 146a or 147b may include a microphone disposed therein so as to acquire external sound, and in some embodiments of the disclosure, a plurality of microphones disposed therein so as to detect the direction of sound. In some embodiments of the disclosure, the speaker holes 145a and 145b and the microphone holes 147a and 147b may be implemented as a single hole, or a speaker may be included without the speaker holes 145a and 145b (e.g., a piezo speaker). According to an embodiment of the disclosure, the speaker hole indicated by reference numeral "145b" may be disposed in the first structure 101 to be utilized as a receiver hole for a voice call, and the speaker hole (e.g., an external speaker hole) indicated by reference numeral "145a" or the microphone holes 147a and 147b may be disposed in the second structure 102 (e.g., one of the side surfaces 123a, 123b, and 123c).

The camera module 149 may be provided in the second structure 102 and may photograph a subject in a direction opposite to the first region A1 of the display 103. The electronic device 100 may include a plurality of camera modules 149. For example, the electronic device 100 may include a wide-angle camera, a telephoto camera, or a close-up camera. According to an embodiment of the disclosure, the electronic device 100 may measure a distance to a subject by including an infrared projector and/or an infrared receiver. The camera module 149 may include one or more lenses, an image sensor, and/or an image signal processor. Although not illustrated, the electronic device 100 may further include a camera module (e.g., a front camera 249 in FIG. 4) for photographing a subject in a direction opposite to the first region A1 of the display 103. For example, the front camera may be disposed around the first region A1 or in a region overlapping the display 103, and when disposed in the region overlapping the display 103, the front camera may photograph a subject through the display 103.

According to various embodiments of the disclosure, an indicator (not illustrated) of the electronic device 100 may be disposed on the first structure 101 or the second structure 102, and may provide state information of the electronic device 100 a visual signal by including a light-emitting diode. A sensor module (not illustrated) of the electronic device 100 may generate an electrical signal or a data value corresponding to an internal operating state of the electronic device 100 or an external environmental state. The sensor module may include, for example, a proximity sensor, a fingerprint sensor, or a biometric sensor (e.g., an iris/face recognition sensor or an HRM sensor). In another embodiment of the disclosure, the sensor module may further include at least one of, for example, a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 3:
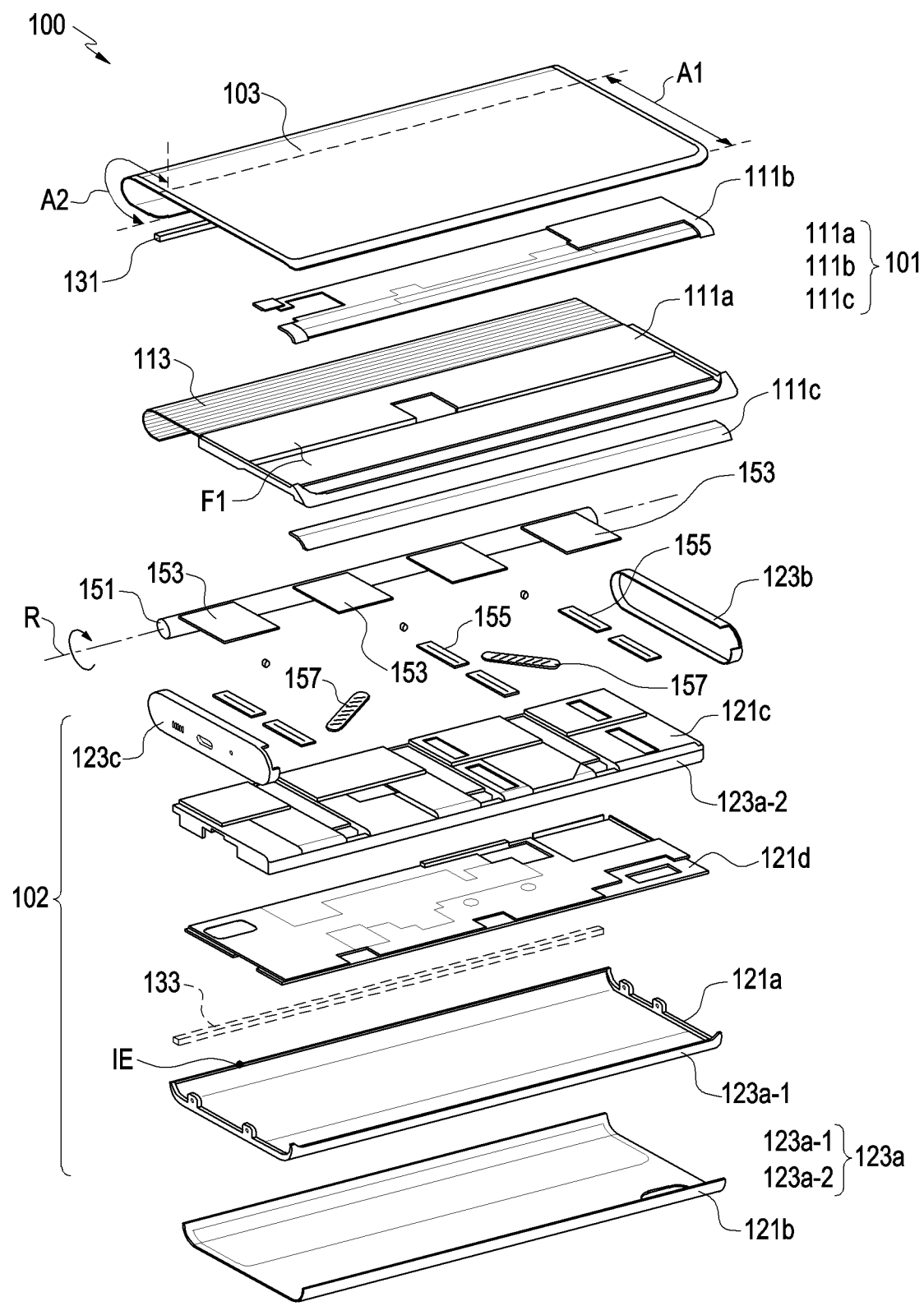
FIG. 3 is an exploded perspective view illustrating an electronic device according to an embodiment of the disclosure.

FIG. 3 is an exploded perspective view illustrating an electronic device (e.g., the electronic device 100 in FIG. 1 or FIG. 2) according to an embodiment of the disclosure.

Referring to FIG. 3, the electronic device 100 may include a first structure 101, a second structure 102 (e.g., a main housing), a display 103 (e.g., a flexible display), a guide member (e.g., the roller 151), a support sheet 153, and/or an articulated hinge structure 113. A portion of the display 103 (e.g., the second region A2) may be accommodated inside the second structure 102 while being guided by the roller 151.

According to various embodiments of the disclosure, the first structure 101 may include a first plate 111a (e.g., a slide plate), and a first bracket 111b and/or a second bracket 111c, which are mounted on the first plate 111a. The first structure 101, for example, the first plate 111a, the first bracket 111b, and/or the second bracket 111c may be made of a metal material and/or a non-metal material (e.g., polymer). The first plate 111a may be mounted on the second structure 102 (e.g., the main housing) to be linearly reciprocable in one direction (e.g., the direction indicated by arrow ① in FIG. 1) while being guided by the second structure 102. In an embodiment of the disclosure, the first bracket 111b may be coupled to the first plate 111a to define the first surface F1 of the first structure 101 together with the first plate 111a. The first region A1 of the display 103 may be substantially mounted on the first surface F1 to maintain a flat plate shape. The second bracket 111c may be coupled to the first plate 111a to define the second surface F2 of the first structure 101 together with the first plate 111a. According to an embodiment of the disclosure, the first bracket 111b and/or the second bracket 111c may be integrated with the first plate 111a. This may be appropriately designed based on the assembly structure or manufacturing process of a manufactured product. The first structure 101 or the first plate 111a may be coupled to the second structure 102 to be slidable relative to the second structure 102.

According to various embodiments of the disclosure, the articulated hinge structure 113 may include a plurality of bars or rods 114 (see FIG. 16 or FIG. 17) and may be connected to one end of the first structure 101. For example, as the first structure 101 slides, the articulated hinge structure 113 may move relative to the second structure 102, and in the closed state (e.g., the state illustrated in FIG. 1), the first structure 101 may be substantially accommodated inside the second structure 102. In some embodiments of the disclosure, even in the closed state, a portion of the articulated hinge structure 113 may not be accommodated inside the second structure 102. For example, even in the closed state, a portion of the articulated hinge structure 113 may be positioned to correspond to the roller 151 outside the second structure 102. The plurality of rods 114 may linearly extend to be disposed parallel to the rotation axis R of the roller 151, and may be arranged in a direction perpendicular to the rotation axis R, for example, the direction in which the first structure 101 slides.

Accordingly, as the first structure 101 slides, the plurality of bars 114 may be arranged to define a curved surface or a flat surface shape. For example, as the first structure 101 slides, the articulated hinge structure 113 may define a curved surface in a portion facing the roller 151, and the articulated hinge structure 113 may define a flat surface in a portion not facing the roller 151. In an embodiment of the disclosure, the second region A2 of the display 103 may be mounted or supported on the articulated hinge structure 113, and in the open state (e.g., the state illustrated in FIG. 2), the second region A2 of the display 103 may be exposed to the outside of the second structure 102 together with the first region A1. In the state in which the second region A2 is exposed to the outside of the second structure 102, the articulated hinge structure 113 may substantially support or maintain the second region A2 in the flat state by defining a flat surface.

According to various embodiments of the disclosure, the second structure 102 (e.g., the main housing) may include a second plate 121*a* (e.g., a rear case), a printed circuit board (not illustrated), a rear plate 121*b*, a third plate (121*c*) (e.g., a front case), and a support member 121*d*. The second plate 121*a* (e.g., the rear case) may be disposed to face away from the first surface F1 of the first plate 111*a* and may substantially provide the external shape of the second structure 102 or the electronic device 100. In an embodiment of the disclosure, the second structure 102 may include a first side wall 123*a* extending from the second plate 121*a*, a second side wall 123*b* extending from the second plate 121*a* to be substantially perpendicular to the first side wall 123*a*, and a third side wall 123*c* extending from the second plate 121*a* to be substantially perpendicular to the first side wall 123*a* and parallel to the second side wall 123*b*. In the illustrated embodiment of the disclosure, a structure in which the second side wall 123*b* and the third side wall 123*c* are manufactured as parts separate from the second plate 121*a* and mounted on or assembled to the second plate 121*a* is exemplified. However, the second side wall 123*b* and the third side wall 123*c* may be manufactured integrally with the second plate 121*a*. The second structure 102 may accommodate an antenna for proximity wireless communication, an antenna for wireless charging, or an antenna for magnetic secure transmission (MST) in a space that does not overlap the articulated hinge structure 113.

According to various embodiments of the disclosure, the rear plate 121*b* may be coupled to the outer surface of the second plate 121*a*, and the rear plate 121*b* may be manufactured integrally with the second plate 121*a* depending on an embodiment. In an embodiment of the disclosure, the second plate 121*a* may be made of a metal or polymer material, and the rear plate 121*b* may be made of a material, such as metal, glass, a synthetic resin, or ceramic to provide a decoration effect in the exterior of the electronic device 100. According to an embodiment of the disclosure, the second plate 121*a* and/or the rear plate 121*b* may be made of a material that transmits light through at least a portion (e.g., an auxiliary display region). For example, in the state in which a portion of the display 103 (e.g., the second region A2) is accommodated in the second structure 102, the electronic device 100 may output visual information using a partial region of the display 103 accommodated inside the second structure 102. The auxiliary display region may provide the visual information output from the region accommodated inside the second structure 102 to the outside of the second structure 102.

According to various embodiments of the disclosure, the third plate 121*c* may be made of a metal or polymer material and may be coupled to the second plate 121*a* (e.g., the rear case), the first side wall 123*a*, the second side wall 123*b*, and/or the third side wall 123*c* to define an internal space of the second structure 102. According to an embodiment of the disclosure, the third plate 121*c* may be referred to as a "front case", and the first structure 101 (e.g., the first plate 111*a*) may slide in the state of substantially facing the third plate 121*c*. In some embodiments of the disclosure, the first side wall 123*a* may be configured by a combination with a first side wall portion 123*a*-1 extending from the second plate 121*a* and a second side wall portion 123*a*-2 disposed at a side edge of the third plate 121*c*. In another embodiment of the disclosure, the first side wall portion 123*a*-1 may be coupled to surround one side edge of the third plate 121*c* (e.g., the second side wall portion 123*a*-2), and in this case, the first side wall portion 123*a*-1 itself may be the first side wall 123*a*.

According to various embodiments of the disclosure, the support member 121*d* may be disposed in a space between the second plate 121*a* and the third plate 121*c* and may have a flat plate shape made of a metal or polymer material. The support member 121*d* may provide an electromagnetic shielding structure in the internal space of the second structure 102 or may improve mechanical rigidity of the second structure 102. In an embodiment of the disclosure, when received inside the second structure 102, the articulated hinge structure 113 and/or a partial region (e.g., the second region A2) of the display 103 may be located in a space between the second plate 121*a* and the support member 121*d*.

According to various embodiments of the disclosure, a printed circuit board (not illustrated) may be disposed in a space between the third plate 121*c* and the support member 121*d*. For example, the printed circuit board may be accommodated in a space separated, by the support member 121*d*, from a space in which a partial region of the articulated hinge structure 113 and/or the display 103 is accommodated inside the second structure 102. On the printed circuit board, a processor, a memory and/or an interface may be mounted. The processor may include one or more of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 100 to an external electronic device, and may include a USB connector, an SD card/an MMC connector, or an audio connector.

According to various embodiments of the disclosure, the display 103 is a flexible display based on an organic light-emitting diode and is at least partially deformable into a curved shape while being generally maintained in a flat shape. In an embodiment of the disclosure, the first region A1 of the display 103 may be mounted on or attached to the first surface F1 of the first structure 101 to maintain a substantially flat plate shape. The second region A2 extends from the first region A1 and may be supported on or attached to the articulated hinge structure 113. For example, the second region A2 may extend along the sliding movement direction of the first structure 101, may be accommodated inside the second structure 102 together with the articulated hinge structure 113, and may be deformed in an at least partially curved shape according to the deformation of the articulated hinge structure 113.

According to various embodiments of the disclosure, as the first structure 101 slides on the second structure 102, the area of the display 103 exposed to the outside may vary. The electronic device 100 (e.g., a processor) may change the region of the display 103 that is activated based on the area of the display 103 exposed to the outside. For example, in the open state or at a position intermediate between the closed state and the open state, the electronic device 100 may activate the region exposed to the outside of the second structure 102 in the total area of the display 103. In the closed state, the electronic device 100 may activate the first region A1 of the display 103 and deactivate the second region A2 of the display 103. In the closed state, when there is no user input for a predetermined period of time (e.g., 30 seconds or 2 minutes), the electronic device 100 may deactivate the entire area of the display 103. In some embodiments of the disclosure, in the state in which the entire area of the display 103 is deactivated, the electronic device 100 may provide visual information through an auxiliary display region (e.g., a portion of the second plate 121a and/or the rear plate 121b made of a material that transmits light) by activating a partial region of the display 103 as needed (e.g., providing a notification or a missed call/message arrival notification according to a user setting).

According to various embodiments of the disclosure, in the open state (e.g., the state illustrated in FIG. 2), substantially the entire region (e.g., the first region A1 and the second region A2) of the display 103 may be exposed to the outside, and the first region A1 and the second region A2 may be disposed to define a plane. In an embodiment of the disclosure, even in the open state, a portion (e.g., one end) of the second region A2 may be located to correspond to the roller 151, and the portion corresponding to the roller 151 in the second region A2 may be maintained in a curved shape. For example, in various embodiments disclosed herein, even if it is stated that "in the open state, the second region A2 is disposed to define a plane", a portion of the second region A2 may be maintained in a curved shape. Similarly, although it is stated that "in the closed state, the articulated hinge structure 113 and/or the second region A2 are accommodated in the second structure 102", a portion of the articulated hinge structure 113 and/or the second region A2 may be located outside the second structure 102.

According to various embodiments of the disclosure, a guide member (e.g., the roller 151) may be rotatably mounted on the second structure 102 at a position adjacent to one side edge of the second structure 102 (e.g., the second plate 121a). For example, the roller 151 may be disposed adjacent to the edge of the second plate 121a parallel to the first side wall 123a (e.g., the portion indicated by reference numeral "IE"). Although reference numerals are not given in the drawings, another side wall may extend from an edge of the second plate 121a adjacent to the roller 151, and the side wall adjacent to the roller 151 may be substantially parallel to the first side wall 123a. As mentioned above, the side wall of the second structure 102 adjacent to the roller 151 may be made of a material that transmits light, and a portion of the second region A2 may provide visual information through a portion of the second structure 102 in the state of being accommodated in the second structure 102.

According to various embodiments of the disclosure, one end of the roller 151 may be rotatably coupled to the second side wall 123b, and the other end may be rotatably coupled to the third side wall 123c. For example, the roller 151 may be mounted on the second structure 102 to be rotatable about a rotation axis R perpendicular to the slide direction of the first structure 101 (e.g., the direction indicated by arrow ① in FIG. 1 or FIG. 2). The rotation axis R may be disposed substantially parallel to the first side wall 123a, and may be located, for example, at one edge of the second plate 121a far from the first side wall 123a. In an embodiment of the disclosure, the gap provided between the outer circumferential surface of the roller 151 and the inner surface of the edge of the second plate 121a may define an inlet through which the articulated hinge structure 113 or the display 103 enters the inside of the second structure 102.

According to various embodiments of the disclosure, when the display 103 is deformed into a curved shape, the roller 151 is able to suppress excessive deformation of the display by maintaining the radius of curvature of the display 103 to a certain degree. "Excessive deformation" may mean that the display 103 is deformed to have an excessively small radius of curvature to the extent that pixels or signal wires included in the display 103 are damaged. For example, the display 103 may be moved or deformed while being guided by the roller 151 and may be protected from damage due to excessive deformation. In some embodiments of the disclosure, the roller 151 may rotate while the articulated hinge structure 113 or the display 103 is inserted into or extracted from the second structure 102. For example, by suppressing friction between the articulated hinge structure 113 (or the display 103) and the second structure 102, the articulated hinge structure 113 (or the display 103) is able to smoothly perform the insertion/extraction operation of the second structure 102.

According to various embodiments of the disclosure, the support sheet 153 may be made of a flexible and somewhat elastic material, for example, a material including an elastic body, such as silicone or rubber. The support sheet 153 may be mounted on or attached to the roller 151 and may be selectively wound around the roller 151 as the roller 151 rotates. In the illustrated embodiment of the disclosure, a plurality of (e.g., four) support sheets 153 may be arranged along the direction of the rotation axis R of the roller 151. For example, the plurality of support sheets 153 may be mounted on the roller 151 such that adjacent support sheets 153 are spaced apart from each other by a predetermined interval, and may extend in a direction perpendicular to the rotation axis R. In other embodiments of the disclosure, one support sheet may be mounted on or attached to roller 151. For example, one support sheet may have a size and shape corresponding to the region in which the support sheets 153 are disposed and the regions between the support sheets 153 in FIG. 3. In this way, the number, size, or shape of the support sheets 153 may be appropriately changed depending on an actually manufactured product. In some embodiments of the disclosure, the support sheet 153 may be rolled on the outer circumferential surface of the roller 151 as the roller 151 rotates or may be spread out from the roller 151 in a flat plate shape from the gap between the display 103 and the third plate 121c. In another embodiment of the disclosure, the support sheet 153 may be referred to as a "support belt", an "auxiliary belt", a "support film", or an "auxiliary film".

According to various embodiments of the disclosure, an end of the support sheet 153 may be connected to the first structure 101 (e.g., the first plate 111a (e.g., a slide plate)), and the support sheet 153 may be rolled on the roller 151 in the closed state (e.g., the state illustrated in FIG. 1). Accordingly, when the first plate 111a moves to the open state (e.g., the state illustrated in FIG. 2), the support sheet 153 may be gradually located between the second structure 102 (e.g., the third plate 121c) and the display 103 (e.g., the second region A2) or between the second structure 102 (e.g., the third plate 121c) and the articulated hinge structure 113. For example, at least a portion of the support sheet 153 may be located to face the articulated hinge structure 113, and may be selectively wound around the roller 151 according to the sliding movement of the first plate 111a. The support sheet 153 may be generally disposed to be in contact with the articulated hinge structure 113, but a portion rolled on the roller 151 may be substantially separated from the articulated hinge structure 113.

According to various embodiments of the disclosure, the gap between the surface of the display 103 and the inner surface of the edge of the second plate 121a may vary according to the extent to which the support sheet 153 is wound around the roller 151. The smaller the gap between the surface of the display 103 and the inner surface of the edge of the second plate 121a, the easier it is to prevent foreign matter from entering the gap between the surface of the display 103 and the inner surface of the edge of the second plate 121a. However, when the gap is excessively small, the display 103 may come into contact with or rub against the second plate 121a. When direct contact or friction occurs, the surface of the display 103 may be damaged or the sliding operation of the first structure 101 may be hindered.

According to various embodiments of the disclosure, in the closed state, since the support sheet 153 is wound around the roller 151, it is possible to reduce the gap between the surface of the display 103 and the inner surface of the edge of the second plate 121a while maintaining the state in which the surface of the display 103 is not in contact with the second plate 121a. For example, by reducing the arrangement gap in the closed state, it is possible to block the inflow of external foreign matter into the inside of the second structure 102. In an embodiment of the disclosure, as the first structure 101 (e.g., the first plate 111a or the slide plate) gradually moves to the open state, the support sheet 153 may move away from the roller 151 to gradually move to the gap between the second structure 102) (e.g., the second plate 121a or the third plate 121c) and the articulated hinge structure 113. For example, as the first structure 101 moves to the open state, the arrangement gap gradually increases so that it is possible to suppress direct friction or contact between the display 103 and another structure (e.g., the second plate 121a) and to prevent the surface of the display 103 from being damaged due to the friction or contact. In some embodiments of the disclosure, the thickness of the support sheet 153 may gradually increase from one end (e.g., the portion fixed to the roller 151) toward the other end (e.g., the portion fixed to the first plate 111a). By using the thickness profile of the support sheet 153, it is possible to adjust the arrangement gap in the closed state and the open state.

According to various embodiments of the disclosure, the electronic device 100 may include at least one elastic member 131 or 133 made of a low-density elastic body, such as a sponge, or a brush. For example, the electronic device 100 may include a first elastic member 131 mounted on one end of the display 103, and may further include a second elastic member 133 mounted on the inner surface of an edge of the second plate 121a depending on an embodiment. The first elastic member 131 may be substantially disposed in the internal space of the second structure 102, and in the open state (e.g., the state illustrated in FIG. 2), the first elastic member 131 may be located to correspond to the edge of the second plate 121a. In an embodiment of the disclosure, the first elastic member 131 may move in the internal space of the second structure 102 according to the sliding movement of the first structure 101. When the first structure 101 moves from the closed state to the open state, the first elastic member 131 may move toward the edge of the second plate 121a. When the first structure 101 reaches the open state, the first elastic member 131 may come into contact with the inner surface of the edge of the second plate 121a. For example, in the open state, the first elastic member 131 may seal the gap between the inner surface of the edge of the second plate 121a and the surface of the display 103. In another embodiment of the disclosure, when moving from the closed state to the open state, the first elastic member 131 may move while being in contact with the second plate 121a (e.g., slide contact). For example, when foreign matter is introduced into the gap between the second region A2 and the second plate 121a in the closed state, the first elastic member 131 may discharge the foreign matter to the outside of the second structure 102 while moving to the open state.

According to various embodiments of the disclosure, the second elastic member 133 may be attached to the inner surface at the edge of the second plate 121a and may be disposed to substantially face the inner surface of the display 103. In the closed state, the gap (e.g., the arrangement gap) between the surface of the display 103 and the inner surface of the edge of the second plate 121a may be substantially determined by the second elastic member 133. According to an embodiment of the disclosure, in the closed state, the second elastic member 133 may seal the arrangement gap by coming into contact with the surface of the display 103. According to an embodiment of the disclosure, the second elastic member 133 may be made of a low-density elastic body, such as a sponge, or a brush, so that the surface of the display 103 may not be damaged even if it comes into direct contact with the display 103. In another embodiment of the disclosure, the arrangement gap may increase as the first structure 101 gradually moves to the open state. For example, the second region A2 of the display 103 may be gradually exposed to the outside of the second structure 102 without substantially coming into contact with or rubbing against the second elastic member 133. When the first structure 101 reaches the open state, the first elastic member 131 may come into contact with the second elastic member 133. For example, in the open state, the first elastic member 131 and the second elastic member 133 may block the inflow of foreign matter by sealing the arrangement gap G.

According to various embodiments of the disclosure, the electronic device 100 may further include a guide rail(s) 155 and/or an actuating member(s) 157. The guide rail(s) 155 may be mounted on the second structure 102 (e.g., the third plate 121c) to guide the sliding movement of the first structure 101 (e.g., the first plate 111a or slide plate). The actuating member(s) 157 may include a spring or a spring module that provides an elastic force in a direction to move opposite ends thereof away from each other. One end(s) of the actuating member(s) 157 may be rotatably supported by the second structure 102, and the other end(s) may be rotatably supported by the first structure 101. When the first structure 101 slides, the opposite ends of the actuating member(s) 157 may be located closest to each other at any one point between the closed state and the open state (hereinafter, referred to as a "closest point"). For example, in the section between the closest point and the closed state, the actuating member(s) 157 may provide an elastic force to the first structure 101 in a direction to move toward the closed state and in the section between the closest point and the open state, the actuating member(s) 157 may provide an elastic force to the first structure 101 in a direction to move toward the open state.

In the following detailed description, the components, which can be easily understood through the preceding embodiments of the disclosure, may be denoted by the same reference numerals as the preceding embodiments or the reference numerals may be omitted, and the detailed description thereof may also be omitted. An electronic device (e.g., the electronic device 100 of FIGS. 1 to 3) according to various embodiments disclosed herein may be implemented by selectively combining configurations of different embodiments of the disclosure, and the configuration of one embodiment may be replaced by that of another embodiment. For example, it is noted that the disclosure is not limited to specific drawings or embodiments.

Figure 4:
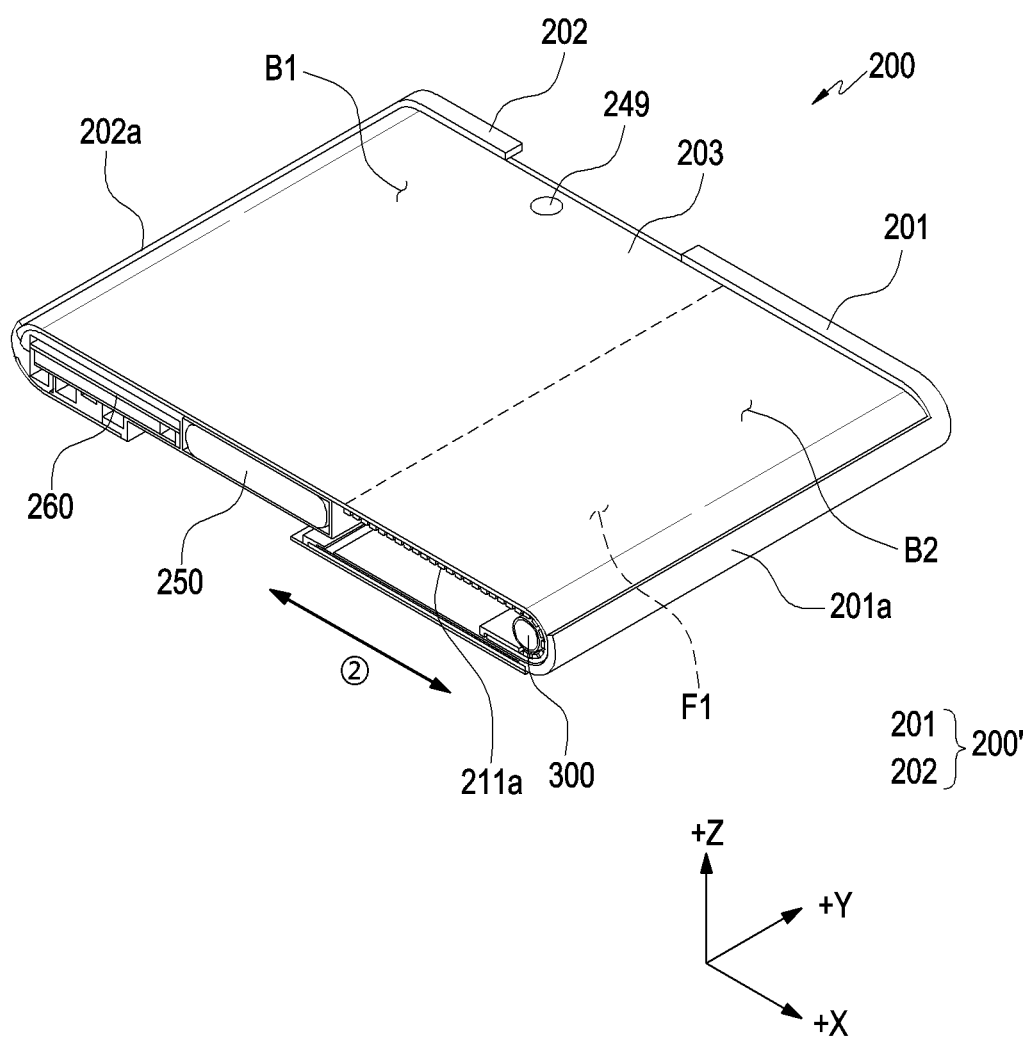
FIG. 4 is an exploded perspective view illustrating a flexible display mounting structure of an electronic device according to an embodiment of the disclosure.

FIG. 4 is a perspective view illustrating an electronic device according to an embodiment of the disclosure.

Referring to FIG. 4, an electronic device 200 may include a first structure 201 and a second structure 202 disposed to be movable on the first structure 201. In some embodiments of the disclosure, the electronic device 200 may be interpreted as a structure in which the first structure 201 is disposed to be slidable on the second structure 202. According to an embodiment of the disclosure, the first structure 201 may be disposed to be reciprocable by a predetermined distance in the illustrated direction (e.g., the direction indicated by arrow ②) relative to the second structure 202.

According to various embodiments of the disclosure, the first structure 201 may be referred to as, for example, a first housing, a slide unit, or a slide housing, and may be disposed to be reciprocable on the second structure 202. In an embodiment of the disclosure, the second structure 202 may be referred to as, for example, a second housing, a main unit, or a main housing, and may accommodate various electrical and electronic components 280, such as a printed circuit board 260 and a battery 250. A portion of the display 203 (e.g., the first region B1) may be seated on the second structure 202. In some embodiments of the disclosure, when the first structure 201 moves (e.g., slides) relative to the second structure 202, another portion of the display 203 (e.g., the second region B2) may be accommodated inside the second structure 202 (e.g., a slide-in operation) or exposed to the outside of the second structure 202 (e.g., a slide-out operation). Here, a portion of the display 203 (e.g., the first region B1) may be a basic use region when the display 203 is in the slide-in state, and another portion of the display 203 (e.g., the second region B2) may be an expanded region in the slide-out state. In the embodiment illustrated in FIG. 4, an embodiment in which the basic use region of the display 203 in the slide-in state is seated on the second structure 202 is illustrated. Referring to the embodiment illustrated in FIG. 4 together with FIGS. 1 to 3, the expanded region in the slide-out state of the display 103 or 203 may be seated via one of the first structure 101 or 201 or the second structure 102 or 202. For example, the disclosure is not limited to any specific embodiment.

According to various embodiments of the disclosure, the first structure 201 and the second structure 202 may constitute, for example, one housing 200'. According to various embodiments of the disclosure, as illustrated in FIGS. 1 to 3, the first structure 101 (e.g., the first housing) is separated from the second structure 102 (e.g., the second housing), wherein, when the display 103 region is expanded, the first structure 101 may protrude outward from the second structure 102. Unlike this, according to the embodiment illustrated in FIG. 4, in the state in which the first structure 201 is configured as a substantially single housing 200' with the second structure 202, the width of the housing 200' can be widened when the display 203 region is expanded.

According to various embodiments of the disclosure, the first structure 201 may include a first plate 211*a* (e.g., a slide plate), and may include a first surface F1 including at least a portion of the first plate 211*a* and a second surface (e.g., the second surface F2 in FIG. 2) facing away from the first surface F1. In various embodiments of the disclosure, the first surface F1 of the first plate 211*a* may be referred to as the first surface F1 of the housing 200', and the second surface F2 of the first plate 211*a* may also be referred to as the second surface F2 of the housing 200'. According to an embodiment of the disclosure, the first plate 211*a* may be wound or unwound in the state of being accommodated in the housing 200'.

According to an embodiment of the disclosure, the housing 200' may include a first side member 201*a* and a second side member 202*a* (e.g., the first side wall 123*a* in FIG. 1) facing away from the first side member 201*a*. According to an embodiment of the disclosure, the first side member 201*a* may be provided in the first structure 201, and the second side member 202*a* may be provided in the second structure 202. When it is described that the width of the housing 200' is widened when the display 203 region is expanded, it may mean that the distance between the first side member 201*a* and the second side member 202*a* increases, and when it is described that the width of the housing 200' is narrowed when the display region is contracted, it may mean that the distance between the first side member 201*a* and the second side member 202*a* decreases. According to an embodiment of the disclosure, the minimum distance between the first side member 201*a* and the second side member 202*a* may define a basic use region of the display 203 in the slide-in state.

According to various embodiments of the disclosure, the electronic device 200 may include at least one member (or at least one rotating member). Referring to FIGS. 1 to 4, the electronic device 200 according to an embodiment may include, as the at least one member, a roller-type rotating member 300. However, this is an example of the at least one member, and the disclosure is not limited thereto. With respect to the above-described roller-type member 300, additionally or alternatively, another type of rotating member may be included. For example, according to various embodiments of the disclosure, a link assembly 400 (see FIG. 8) configured to be foldable as a member may be included. In addition, it should be noted that any configuration capable of implementing or inducing a linear motion when the display is expanded using a rotational motion may be included in the scope of "the at least one member" of the disclosure.

Figure 5A:
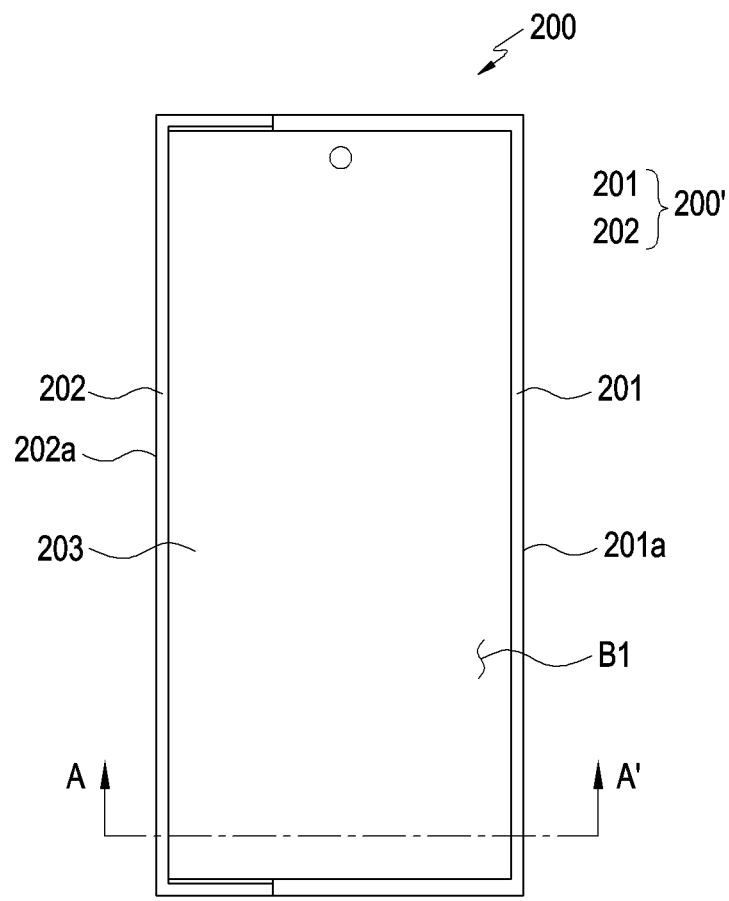
FIGS. 5A and 5B are views illustrating an electronic device in a state in which a flexible display region is contracted according to various embodiments of the disclosure.
Figure 5B:
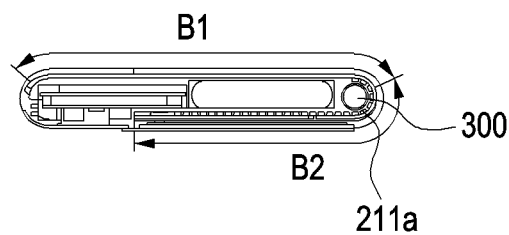
Figure 6A:
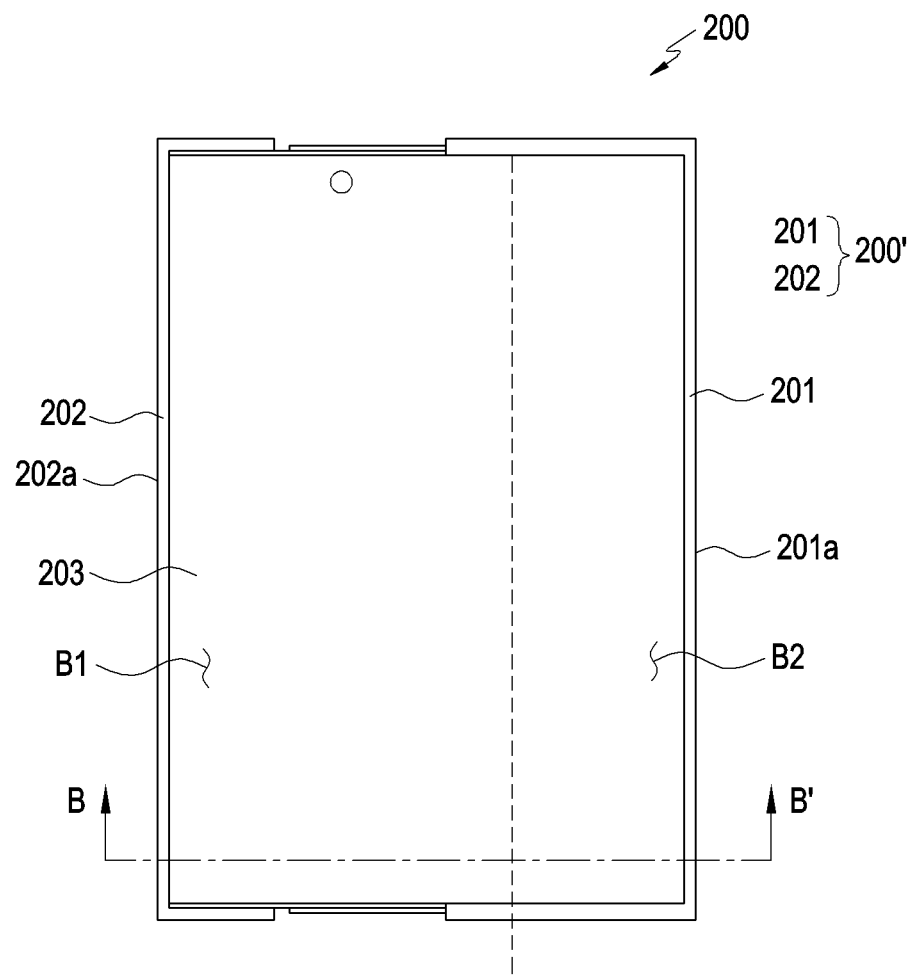
FIGS. 6A and 6B are views illustrating an electronic device in a state in which a flexible display region is expanded according to various embodiments of the disclosure.
Figure 6B:
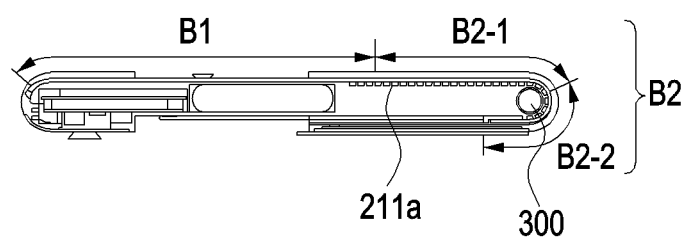

FIGS. 5A and 5B are views illustrating an electronic device in a state in which a region of a flexible display is contracted according to various embodiments of the disclosure. FIGS. 6A and 6B are views illustrating an electronic device in a state in which a region of a flexible display is expanded according to various embodiments of the disclosure.

Here, FIGS. 5A and 5B may illustrate the state in which a portion of the flexible display 203 (e.g., the second region B2) is accommodated in the second structure 202. The state illustrated in FIGS. 5A and 5B may be defined as the state in which as first structure 201 is closed with respect to the second structure 202, and the state illustrated in FIGS. 6A and 6B may be defined as the state in which the first structure 201 is open with respect to the second structure 202. According to an embodiment of the disclosure, the "closed state" or the "open state" may be defined as the state in which the electronic device is closed or the state in which the electronic device is open.

Referring to FIGS. 5A and 6A together, the first structure 201 and the second structure 202 may form a single housing 200'. Thus, a bezel region of the first structure 201 (or the side wall of the first structure 201) may be correspondingly connected to the bezel region of the second structure 202 (or the side wall of the second structure 202).

FIGS. 5A and 5B illustrate the state in which only the basic use region (e.g., the first region B1) in the slide-in state of the display 203 is exposed to the outside. In the slide-out state of the display 203, as illustrated in FIG. 6A, the expanded region (e.g., the second region B2) is additionally exposed to the outside so that the first region can be substantially expanded. Referring to FIGS. 6A and 6B, when the first side member 201a of the housing 200' slides, at least a portion B2-1 of the second region B2 is oriented in the first direction so that the first region can be substantially expanded.

Referring to FIGS. 5B and 6B, in the slide-out state, the second region B2 of the flexible display 203 may extend from the first region B1, wherein a portion (e.g., B2-1) may be oriented in a first direction that is the same as the first region B1, and another portion (e.g., B2-2) may be configured to be oriented in a second direction opposite to the first direction. According to some embodiments of the disclosure, in a state in which the flexible display 203 is fully expanded, the other portion (e.g., B2-2) may be an unused portion. According to an embodiment of the disclosure, the other portion (e.g., B2-2) of the second region B2 may be connected to the rear plate (e.g., the rear plate 220 in FIG. 7) of the electronic device 200 so as to serve to maintain the tension of the first plate 211a.

Figure 7:
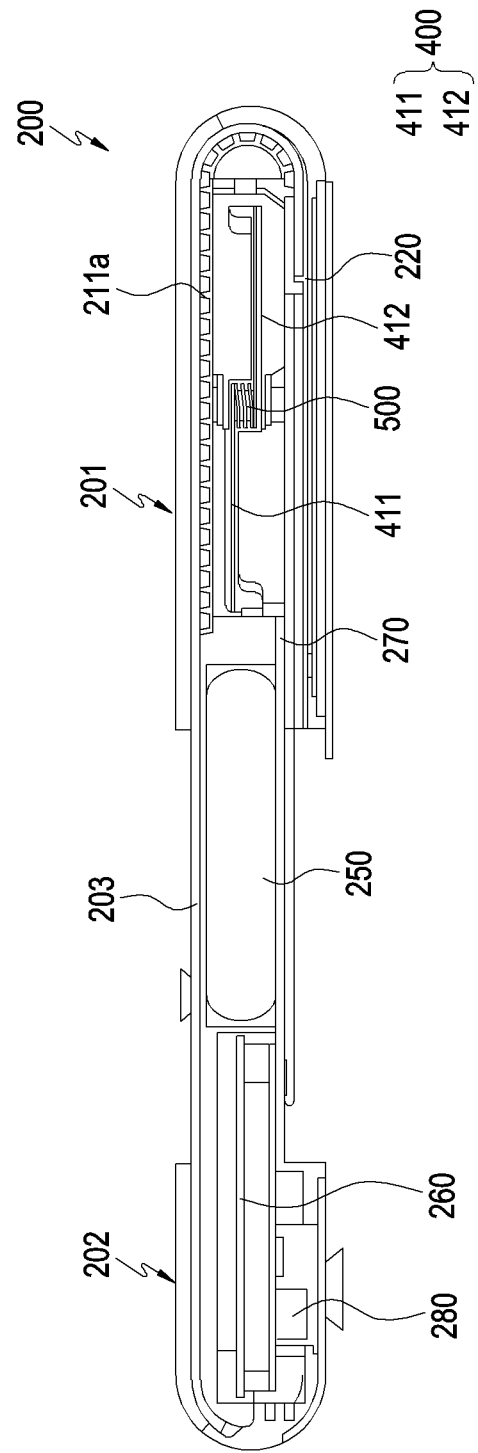
FIG. 7 is a view illustrating an electronic device in a state in which a link assembly is provided inside a housing according to an embodiment of the disclosure.

FIG. 7 is a view illustrating an electronic device in a state in which a link assembly is provided inside a housing according to an embodiment of the disclosure.

Referring to FIG. 7, according to various embodiments of the disclosure, the rollable electronic device 200 may include a flexible display 203 and a plate that supports at least a portion of the flexible display 203 and slides to cause at least a portion of the second region (e.g., the second region B2 in FIG. 6B) of the flexible display 203 to be oriented in the first direction so that the first region (e.g., the first region B1 in FIG. 6B) can be substantially expanded. In addition, the rollable electronic device 200 may further include at least one member that enables the sliding movement of the plate through a rotational motion. Here, as illustrated in FIGS. 1 to 4, 5A, 5B, 6A, and 6B, the at least one member may be a roller, but does not necessarily correspond thereto. The at least one member may be configured as a link assembly 400 as illustrated in FIG. 7 and subsequent figures. Hereinafter, regarding the "at least one member", the link assembly 400 including a plurality of arms (e.g., 411 and 412) will be described as an example.

According to various embodiments of the disclosure to be described below, a rotation detection sensor configured to measure the rotation amount of the link assembly 400, a flexible printed circuit board (hereinafter, referred to as a flexible printed circuit board "(FPCB)") structure on which the rotation detection sensor is mounted, a shielding structure configured to shield an external magnetic field acting on the rotation detection sensor, and the like may be provided.

According to various embodiments of the disclosure, the plate (e.g., the first plate 211a) may serve to prevent an expandable or contractible display 203 from sagging, and for this purpose, the plate may be disposed on the rear surface of the display. According to an embodiment of the disclosure, since an internal space (e.g., the internal space S in FIG. 6B) may be produced on the rear surface of the plate (e.g., the first plate 211a) when the display 203 is expanded, a structure for supporting the plate (e.g., the first plate 211a) may be required. For example, the link assembly 400 may be provided as a structure for supporting the plate (e.g., the first plate 211a).

According to various embodiments of the disclosure, the link assembly 400 of the rollable electronic device 200 may be provided to be foldable in the internal space S of the rollable electronic device 200. The link assembly 400 may include a plurality of arms (e.g., 411 and 412), and the plurality of arms (e.g., 411 and 412) may be configured to be rotatable around at least one rotating axis.

According to another embodiment of the disclosure, the rotating member illustrated in FIG. 7 may further include a spring (e.g., a torsion spring 500) configured to provide an elastic repulsive force and/or an elastic supporting force to the rotational operation thereof.

Figure 8:
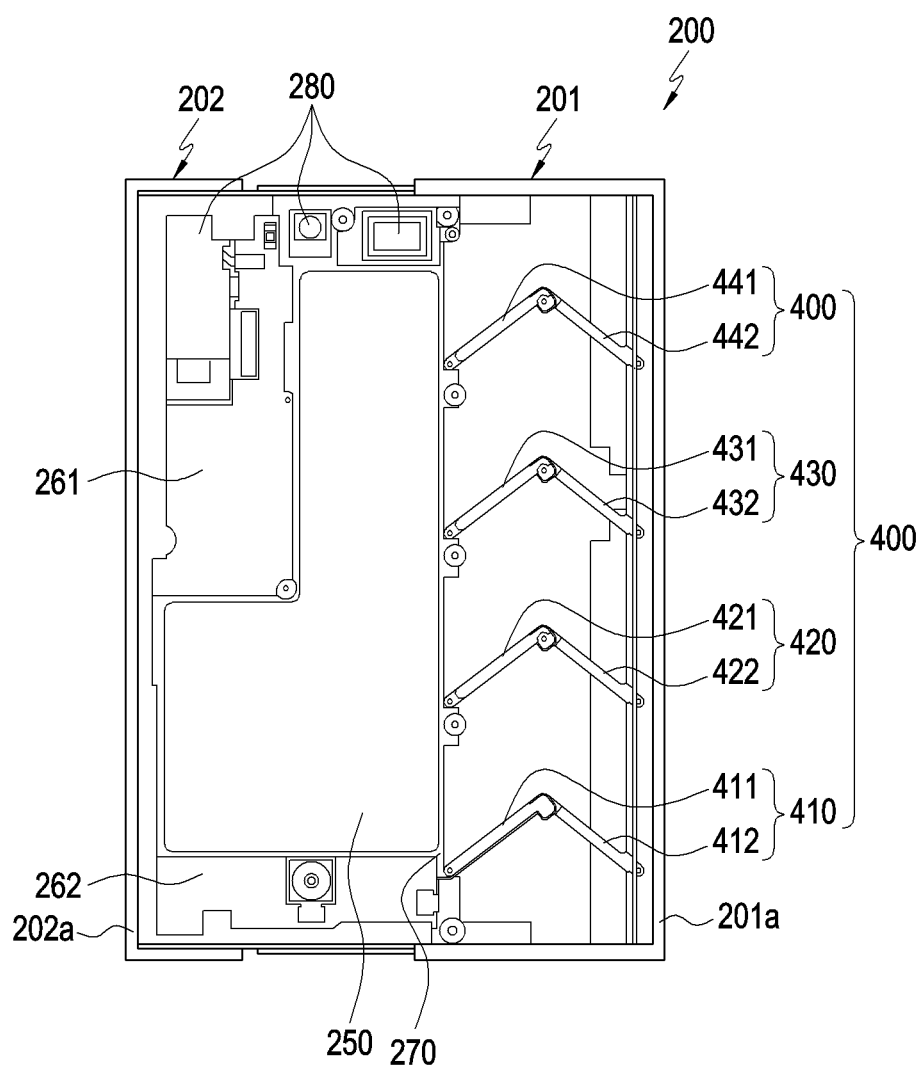
FIG. 8 is a view illustrating an electronic device in a state in which a link assembly operates when a display region is expanded according to an embodiment of the disclosure.

FIG. 8 is a view illustrating a rollable electronic device in a state in which a link assembly is expanded when a display region is expanded according to an embodiment of the disclosure.

Referring to FIG. 8, according to various embodiments of the disclosure, the rollable electronic device 200 may further include printed circuit boards 261 and 262 accommodated in the housing and a bracket 270 supporting the printed circuit boards 261 and 262. As described above with reference to FIG. 7, in the embodiment of FIG. 8 and subsequent figures, the link assembly 400 may be applied as the at least one member that enables the sliding movement of the plate through a rotational motion, and the link assembly 400 may be disposed between one side of the printed circuit boards 261 and 262 and/or the bracket 279 and the first side member 201a.

According to various embodiments of the disclosure, a plurality of link assemblies 400 may be provided in the internal space of the electronic device 200. Referring to FIG. 8, the link assembly 400 may include a first link assembly 410, a second link assembly 420, a third link assembly 430, and a fourth link assembly 440.

When the link assembly 400 is folded, the display of the rollable electronic device 200 can be contracted, and when the link assembly 400 is unfolded, the display of the rollable electronic device 200 can be expanded. According to various embodiments of the disclosure, when the display is expanded, the width of the housing of the rollable electronic device 200 and the space between one side of the printed circuit boards 261 and 262 and/or the bracket 270 and the first side member 201a can be widened.

All of the first link assembly 410, the second link assembly 420, the third link assembly 430, and the fourth link assembly 440 may have substantially the same configuration to perform substantially the same operation. For example, all of the first link assembly 410, the second link assembly 420, the third link assembly 430, and the fourth link assembly 440 may be different from each other only in position in which each of the link assemblies is disposed in the internal shape (e.g., the space S in FIG. 6B) of the rollable electronic device 200, and may be equal to each other in size and shape. As another example, when the first link assembly 410 is folded, the second link assembly 420, the third link assembly 430, and the fourth link assembly 440 may also be folded, and when the first link assembly 410 is unfolded, the second link assembly 420, the third link assembly 430, and the fourth link assembly 440 may also be unfolded.

According to various embodiments of the disclosure, the first to fourth link assemblies 410, 420, 430, and 440 may include first arms 411, 421, 431, and 441 rotatably coupled to the printed circuit boards 261 and 262 and/or the bracket 270, respectively, and second arms 412, 422, 432, and 442 rotatably coupled to the first arm 411, 421, 431, and 441, respectively, and rotatably coupled to the first side member 201a.

Figure 9:
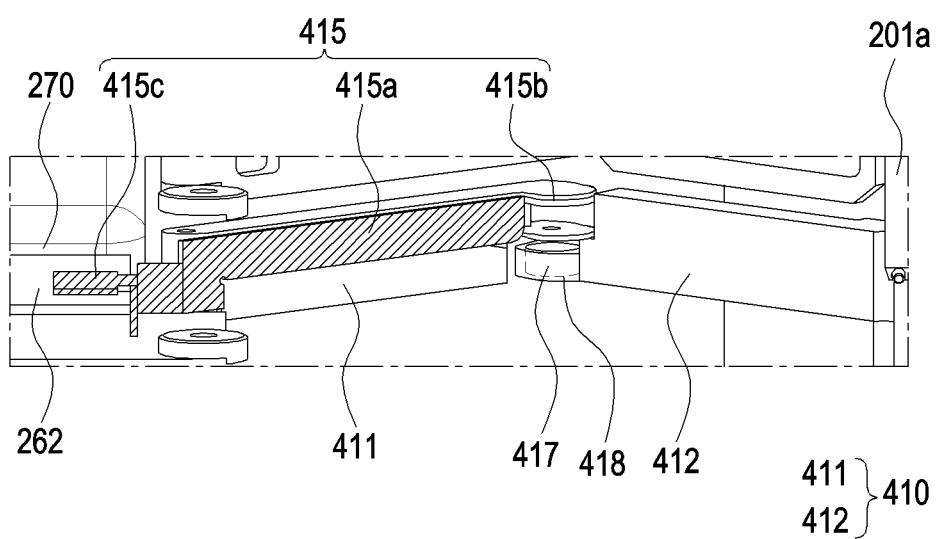
FIG. 9 is a perspective view illustrating an electronic device in which a link assembly is illustrated according to an embodiment of the disclosure.
Figure 10:
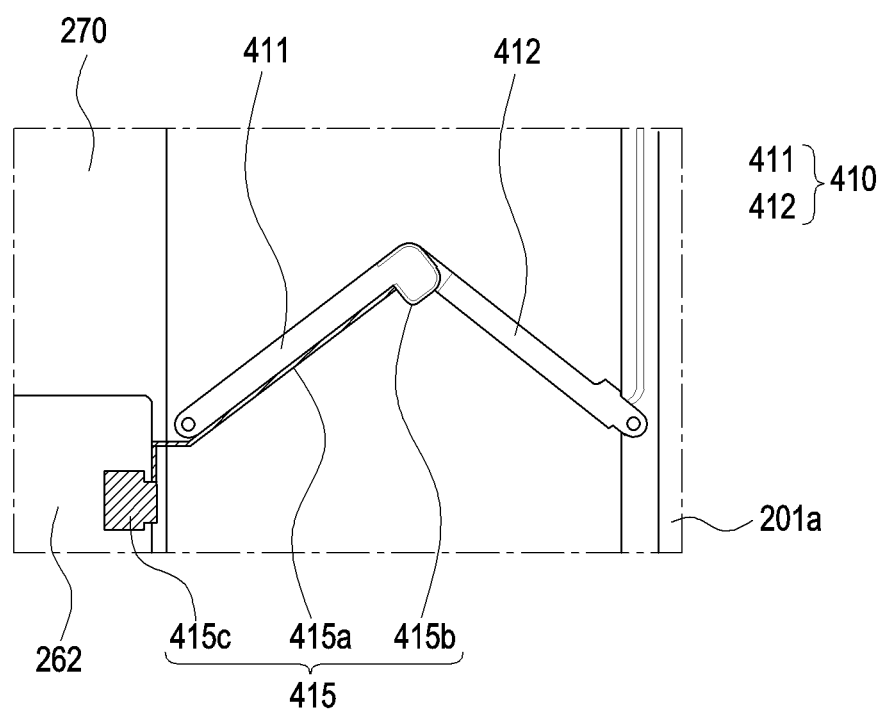
FIG. 10 is a front view illustrating an electronic device in which a link assembly is illustrated according to an embodiment of the disclosure.

According to various embodiments of the disclosure, the first to fourth link assemblies 410, 420, 430, and 440 may be provided at the lower end of the first plate 211a and may be configured to support the first plate 211a. Since the first to fourth link assemblies 410, 420, 430, and 440 are provided to support the lower end of the first plate 211a, sagging of the first plate 211a can be prevented when the display is expanded. FIG. 9 is a perspective view illustrating a link assembly (e.g., a first link assembly 410) in an electronic device according to an embodiment of the disclosure. FIG. 10 is a front view illustrating a link assembly (e.g., the first link assembly 410) in an electronic device according to an embodiment of the disclosure. Hereinafter, in describing various embodiments of the "link assembly 400", among the plurality of link assemblies 410, 420, 430, and 440, the first link assembly 410 will be described as an example.

Referring to FIGS. 9 and 10, according to various embodiments of the disclosure, the rollable electronic device (e.g., the rollable electronic device 200 in FIG. 8) may include a rotation detection sensor 416 configured to measure a rotation angle of the first link assembly 410. The rotation detection sensor 416 may be provided to detect the amount of rotation (rotation angle) of the first link assembly 410. In addition, the rollable electronic device (e.g., the rollable electronic device 200 in FIG. 8) may further include a magnet 417 disposed to correspond to the rotation detection sensor 416.

According to various embodiments of the disclosure, the rotation detection sensor 416 may be disposed on at least one of a first rotating axis (e.g., the first rotating axis 411a of FIG. 16 below) to which the first arm 411 and the printed circuit boards 261 and 262 and/or the bracket 270 are coupled, a second rotating axis (e.g., the second rotating axis 411b of FIG. 16 below) to which the first arm 411 and the second arm 412 are coupled, and a third rotating axis (e.g., the third rotating axis 412a of FIG. 16 below) to which the second arm 412 and the first side member 201a are coupled.

FIG. 9 illustrates an embodiment in which the rotation detection sensor 416 is positioned on a second rotating axis (e.g., the second rotating axis 411b of FIG. 16 below) to which the first arm 411 and the second arm 412 are coupled. In addition, an embodiment in which a magnet 417 is disposed at a position corresponding to the rotation detection sensor 416 is illustrated. For example, a rotation detection sensor 416 may be disposed at one end of the first arm 411, and a magnet 417 corresponding to the rotation detection sensor 416 may be provided on the second arm 412. The magnet 417 may be disposed at one end of the second arm 412, and may be accommodated in a seating portion 418 disposed to be spaced apart from the rotation detection sensor 416 by a predetermined distance.

According to another embodiment of the disclosure, the electronic device 200 may further include an FPCB 415 configured to electrically connect the rotation detection sensor 416 to a printed circuit board inside the housing.

According to various embodiments of the disclosure, the FPCB 415 may be further coupled to the link assembly 410. According to an embodiment of the disclosure, the FPCB 415 may be electrically connected to the printed circuit board 262 and may be provided at a position at which the electrical length thereof is minimized. For example, the FPCB 415 may be disposed on the first arm 411 adjacent to the printed circuit board 262 in the first link assembly 410.

According to various embodiments of the disclosure, the FPCB 415 may include a flat plate portion 415a coupled to the first arm 411, a first end 415b coupled to the second arm 412, and a second end 415c connected in parallel to the printed circuit board 262. The flat plate portion 415a of the FPCB 415 may overlap the first arm 411 or may be fitted into a groove provided in the first arm 411, and may be disposed to be perpendicular to the first surface (e.g., the first surface F1 in FIG. 4) of the rollable electronic device 200 like the first arm 411. On the first end 415b of the FPCB 415, the rotation detection sensor 416 may be disposed, and the first end 415b may be disposed to be parallel to the first surface (e.g., the first surface F1 in FIG. 4) of the rollable electronic device 200 such that the rotation detection sensor 416 and the magnet 417 of the second arm 412 face each other at positions spaced apart from each other by a predetermined distance. The second end 415b of the FPCB 415 may be disposed parallel to the first surface (e.g., the first surface F1 in FIG. 4) of the rollable electronic device 200 to be in contact with the printed circuit board 262. Hereinafter, as will be described later with reference to FIG. 14, the rotation detection sensor 416 may be disposed at a second end 415b of the FPCB 415. As described above, the FPCB 415 may have a shape in which the first end 415b and the second end 415c are perpendicular to the flat plate portion 415a. In this way, the FPCB 415 may be integrally configured with the first arm 411 and may operate integrally with the operation of the first arm 411. In addition, since the FPCB 415 is formed such that most of the area is in contact with the first arm 411, even if the rollable electronic device 200 is additionally provided with an FPCB, it is possible to minimize an increase in the volume of the electronic device due to the addition of the FPCB.

According to various embodiments of the disclosure, an FPCB structure, which includes a magnetic rotary position sensor as the rotation detection sensor and on which a magnet and the rotary position sensor are mounted, is configured as an integrated form. Thus, it is possible to measure the correct position of the display by converting the amount of change in the left and right linear motion according to the expansion and contraction of the display into a rotating motion on the rotating axis of the hinge without requiring an additional mounting space.

Figure 11:
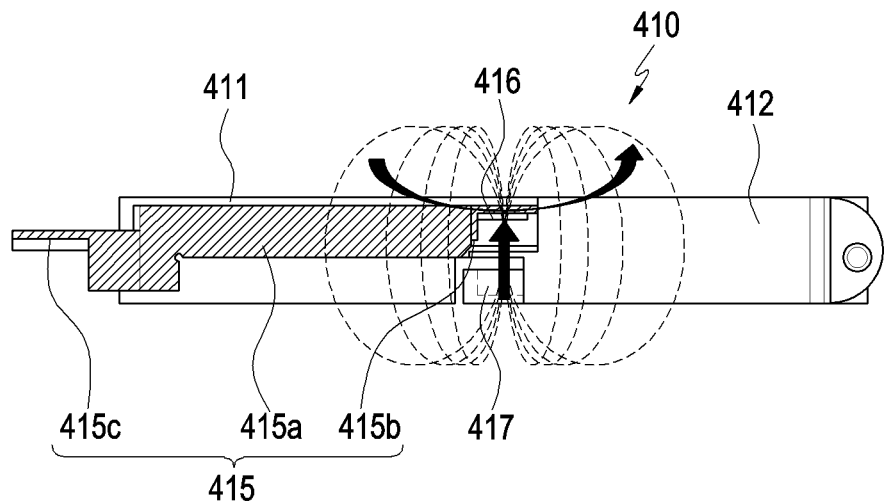
FIG. 11 is a view illustrating a link assembly in which a rotation detecting method is illustrated according to an embodiment of the disclosure.

FIG. 11 is a view illustrating a link assembly (e.g., the first link assembly 410) in which a method of detecting the rotation of the link assembly (e.g., the first link assembly 410) using a rotation detection sensor 416 is illustrated according to an embodiment of the disclosure.

Referring to FIG. 11, the rotation detection sensor 416 provided in the first arm 411 is capable of measuring the rotation angle of the first link assembly 410 by measuring the intensity of a magnetic field generated by a magnet 417 provided at a position corresponding to the rotation detection sensor 416 in the second arm 412. According to an embodiment of the disclosure, the distance between the rotation detection sensor 416 and the magnet 417 may be fixed to be spaced apart from each other by a predetermined distance. Accordingly, the rotation detection sensor 416 may measure a magnetic field having a certain intensity. According to an embodiment of the disclosure, a relative rotation angle is measured through a change in magnetic field between the rotation detection sensor 416 rotating along the rotating axis and the magnet 417, wherein by fixing the distance between the rotation detection sensor 416 and the magnet on the rotating axis constant, it is possible to minimize the change in intensity of magnetic force when measuring the rotation angle. For example, when the intensity of magnetic force is changed by an external magnetic field, it may be estimated that the change is not a change in magnetic field between the rotation detection sensor 416 and the magnet 417 due to the rotation of the rotating member, and the effect of the change may be excluded when measuring the rotation angle.

Figure 12:
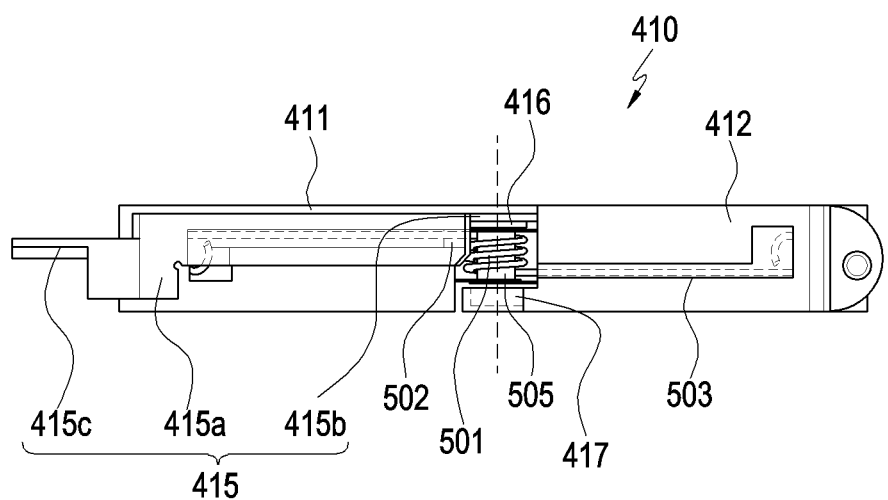
FIG. 12 is a view illustrating a link assembly further including a torsion spring according to an embodiment of the disclosure.

FIG. 12 is a view illustrating a link assembly (e.g., the first link assembly 410) further including a torsion spring according to an embodiment of the disclosure.

Referring to FIG. 12, the link assembly (e.g., the first link assembly 410) further including the torsion spring 500 may include a torsion spring 500 seating portion, which is provided in each of the first arm 411 and the second arm 412. Through this, one end 502 of the torsion spring 500 may be mounted on the first arm 411, and the other end 503 of the torsion spring 500 may be mounted on the second arm 412. The winding portion 501 of the torsion spring 500 may be disposed to surround the spring guide 505 disposed on the second rotating axis of the link assembly (e.g., the second rotating axis 412a of FIG. 16 below).

According to various embodiments of the disclosure, the spring guide 505 may have a hollow cylindrical structure configured such that a magnetic flux passes through the internal space thereof.

Figure 13:
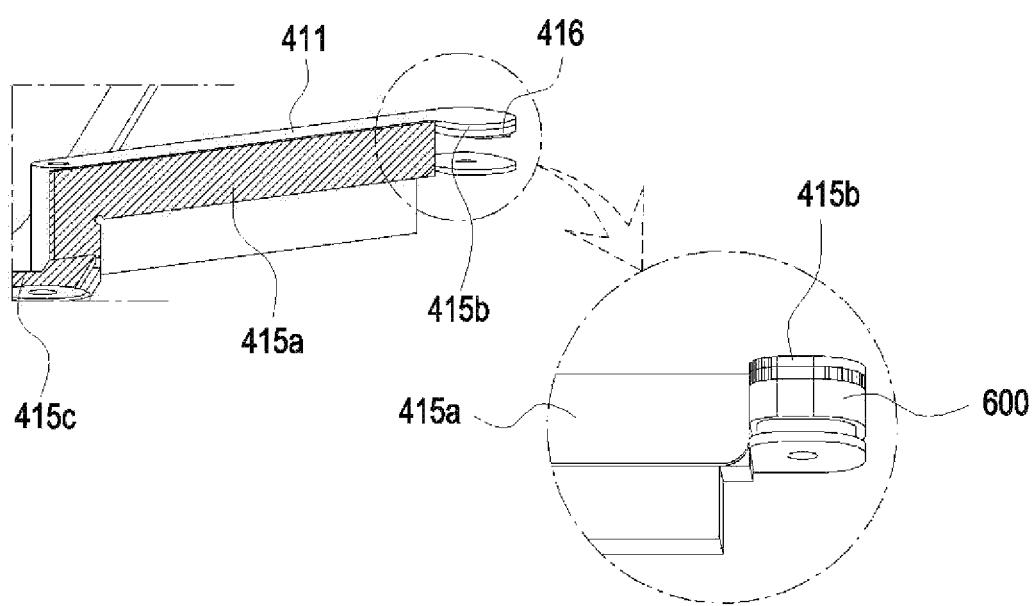
FIG. 13 is a view illustrating a link assembly further including a shielding structure according to an embodiment of the disclosure.
Figure 14:
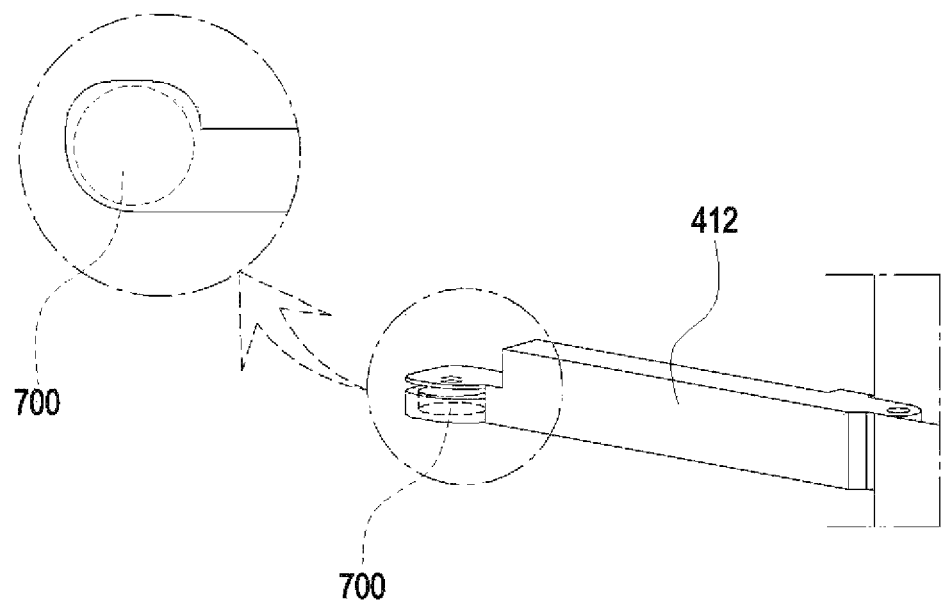
FIG. 14 is a view illustrating a link assembly further including a shielding material according to an embodiment of the disclosure.

FIG. 13 is a view illustrating a link assembly (e.g., the first link assembly 410) further including a shielding structure according to an embodiment of the disclosure. FIG. 14 is a view illustrating a link assembly (e.g., the first link assembly 410) further including a shielding material according to an embodiment of the disclosure. A shielding structure 600 and a shielding material 700 may constitute a shielding portion that shields at least a portion around the rotation detection sensor.

Referring to FIGS. 13 and 14, the rollable electronic device 200 according to various embodiments may further include a shielding structure 600 or a shielding material 700 to protect components from the influence of a magnetic field. For example, the shielding structure 600 may be a shielding wall provided to shield against an external magnetic field around the rotation detection sensor 416, and at the end of the first arm 411, the shielding structure 600 may protrude by a predetermined height in the axial direction of the rotating axis. In addition, for example, the shielding material 700 may be a coating paint (or film) for shielding provided to correspond to the rotation detection sensor 416, and at the end of the second arm 412, the shielding material 700 may be provided on the bottom and/or the side surface of the magnet 417 seating surface. According to an embodiment of the disclosure, by including the shielding structure 600 or the shielding material 700, it is possible to prevent an external magnetic field from affecting the rotation detection sensor 416 or prevent a magnetic field of the magnet 417 from affecting the electronic components mounted on a printed circuit board of the rollable electronic device 200. The rotation detection sensor 416 can accurately measure the change in the magnetic field of the magnet 417 disposed on the direction of the rotating axis of the first link assembly 410. In addition, since the external magnetic field can be effectively blocked at this time, it is possible to correctly measure the rotation angle.

Figure 15:
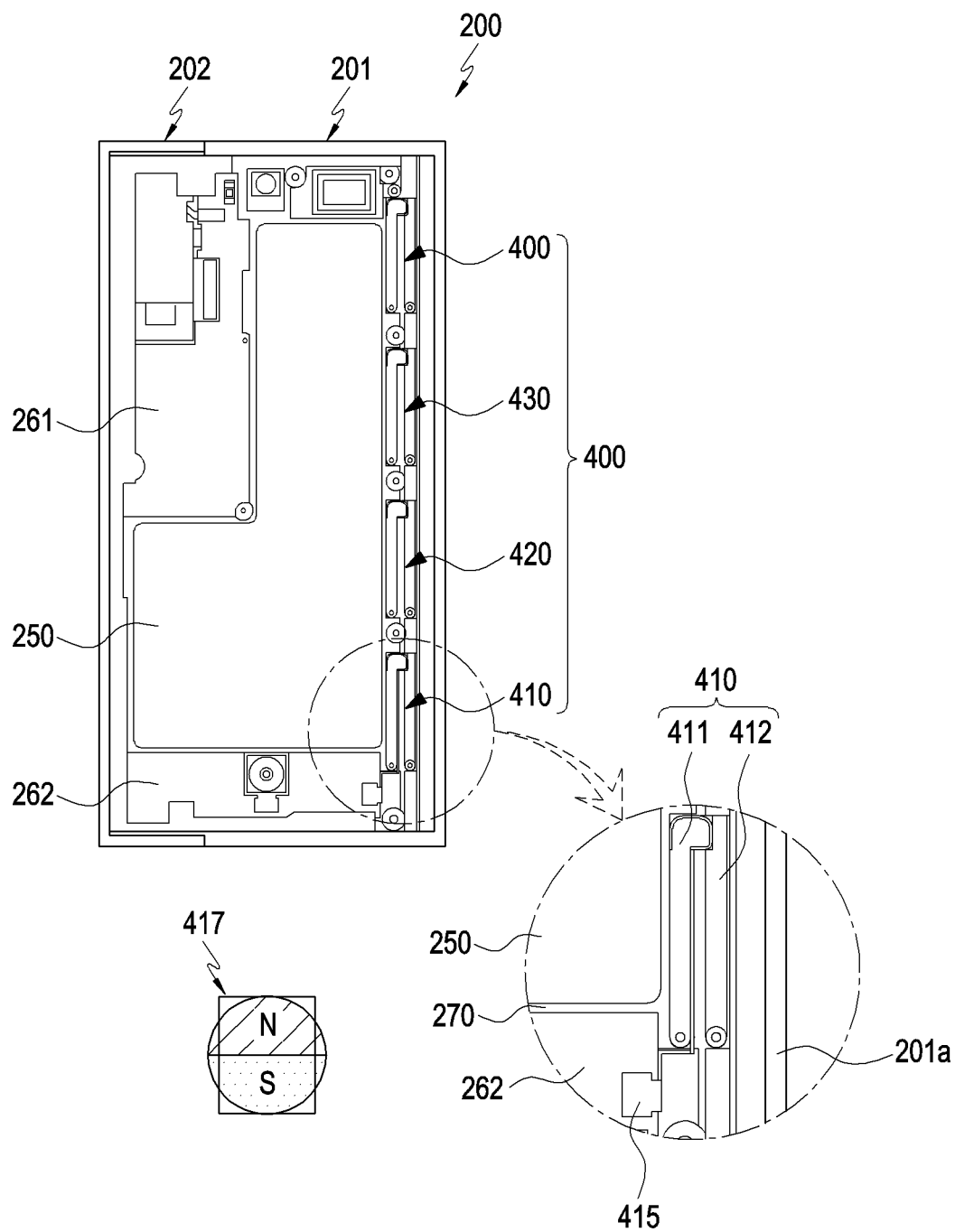
FIG. 15 is a view illustrating an electronic device in a state in which a display region is contracted according to an embodiment of the disclosure.
Figure 16:
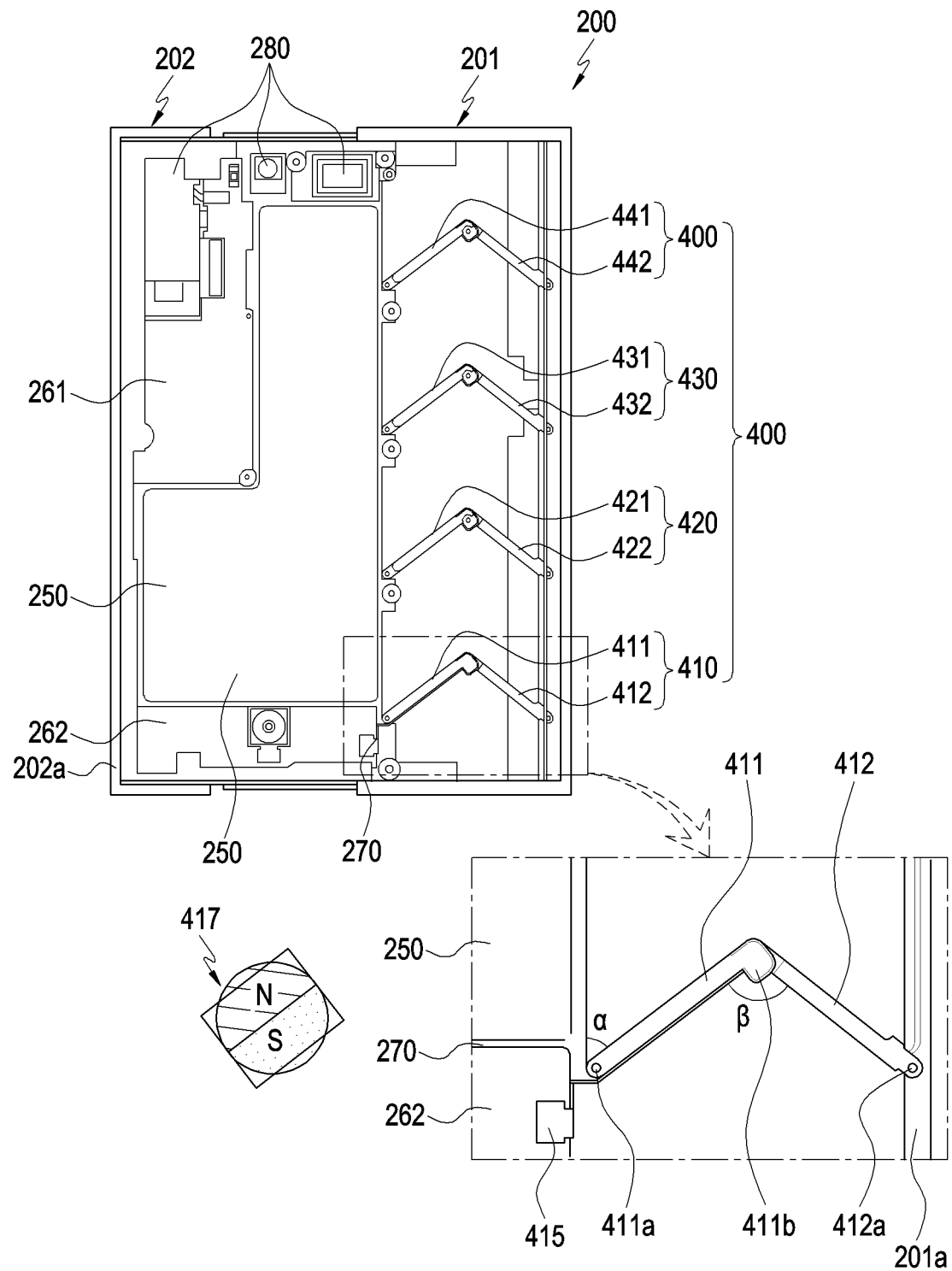
FIG. 16 is a view illustrating an electronic device in the state in which the display region is expanded according to an embodiment of the disclosure.
Figure 17:
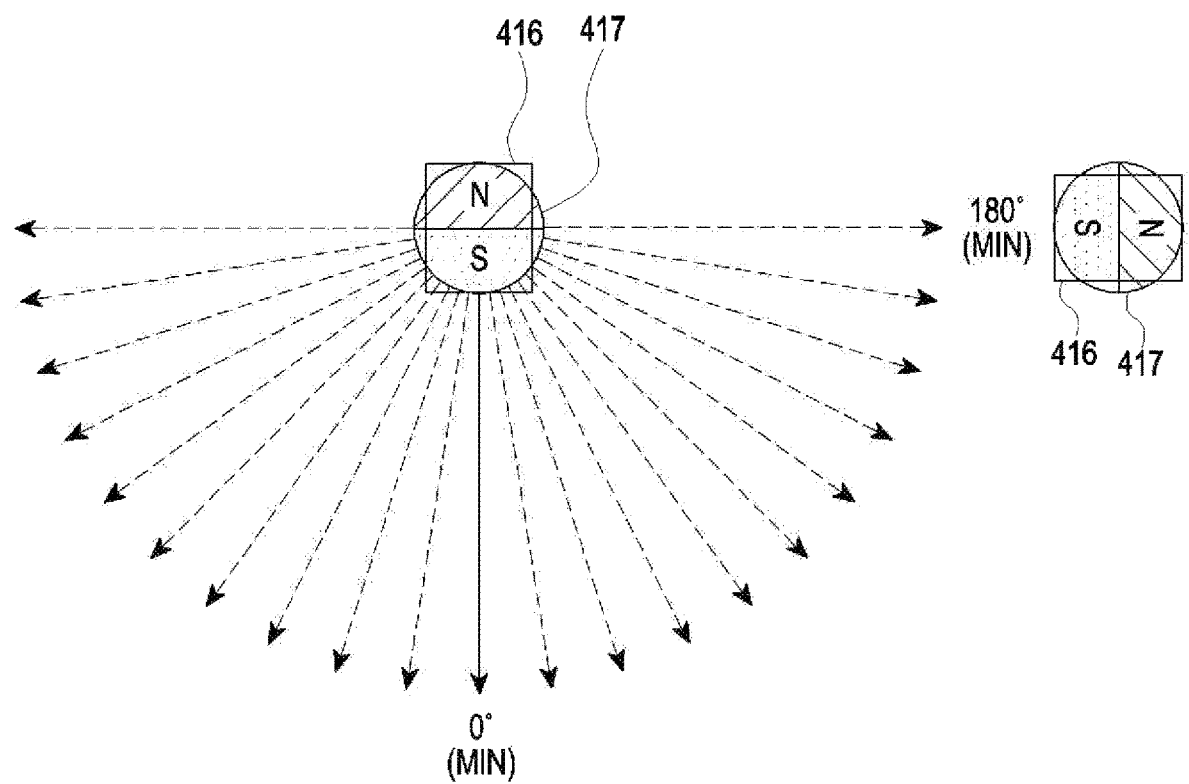
FIG. 17 is a conceptual diagram illustrating a range in which an angle between a rotary sensor and a magnet is variable according to an embodiment of the disclosure.
Figure 18:
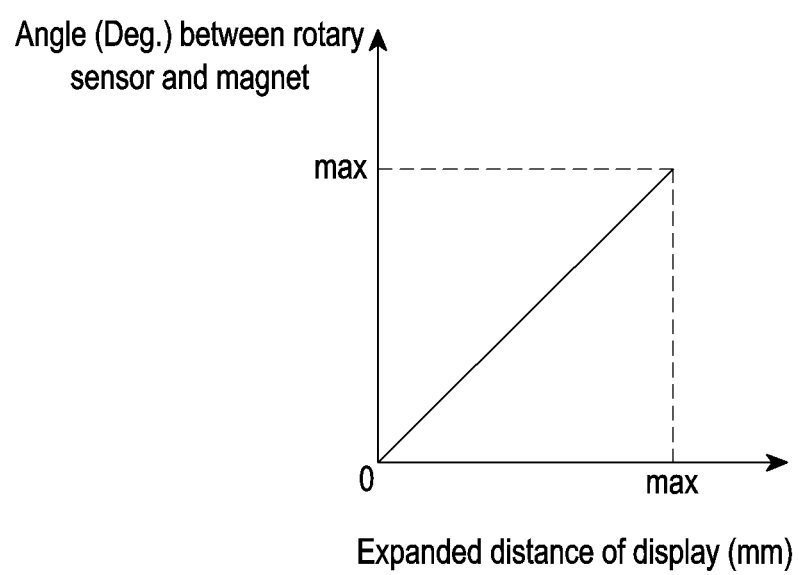
FIG. 18 is a graph illustrating a relationship between an angle between a rotation detection sensor and a magnet and a display expansion distance according to an embodiment of the disclosure.

FIG. 15 is a view illustrating a rollable electronic device in a state in which a display region is contracted according to an embodiment of the disclosure. FIG. 16 is a view illustrating a rollable electronic device in a state in which a display region is expanded according to an embodiment of the disclosure. FIG. 17 is a conceptual diagram illustrating a range in which an angle between a rotary sensor and a magnet is variable according to an embodiment of the disclosure. FIG. 18 is a graph illustrating a relationship between an angle between a rotation detection sensor and a magnet and a display expansion distance according to an embodiment of the disclosure.

According to various embodiments of the disclosure, when expanding or contracting the rollable electronic device 200 using the link assembly 400 included in the rollable electronic device 200, the linear movement distance of the display can be accurately measured. The rotating member 410 is divided into the first arm 411 and the second arm 412, so that the FPCB 415 and the rotation detection sensor 416 are mounted on the first arm 411, and a magnet for detection is mounted on the second arm 412. Thus, when the rotating member rotates, the rotation detection sensor 416 and the magnet 417, which are mounted on the first arm 411 and the second arm 412, respectively, rotate together with the rotating member 410 so that a specific angle corresponding to the expanded or contracted length of the display can be formed between the rotation detection sensor 416 and the magnet 417.

Referring to FIGS. 15 and 16 together, by including the link assembly 400 (e.g., the first link assembly 410) constituted with the first arm (e.g., the first arm 411) and the second arm (e.g., a second arm 412) operated when the display is expanded or contracted, the rollable electronic device 200 includes a first rotating axis 411a to which the first arm 411 and the printed circuit boards 261 and 262 and/or the bracket 270 are coupled, a second rotating axis 411b to which the first arm 411 and the second arm 412 are coupled, and a third rotating axis 412a to which the second arm 412 and the first side member 210a are coupled.

According to various embodiments of the disclosure, the linear movement distance of the display according to the expansion or contraction of the display may be converted into the rotation angle based on the rotation of the rotating axis. In addition, according to various embodiments of the disclosure, it is possible to calculate an actual display position (or a moving distance) by measuring a rotation angle using a rotation detection sensor provided on a rotating axis, converting the rotation angle into a length in a processor (e.g., a micro-control unit), and mapping the length with the expanded or contracted length of the display.

According to various embodiments of the disclosure, the rotation detection sensor (e.g., the rotation detection sensor 416 in FIG. 9) may be provided on at least one of the plurality of rotating axis 411a, 411b, and 412a. According to an embodiment of the disclosure, the rotation detection sensor may be disposed on the first rotating axis 411a. Alternatively, according to another embodiment of the disclosure, as described above with reference to FIG. 9, a rotation detection sensor may be disposed on the second rotating axis 411b. When the rotation detection sensor is disposed on the first rotating axis 411a, there is an advantage in that the length of the FPCB can be minimized or the FPCB can be omitted. However, when the rotation detection sensor is disposed on the first rotating axis 411a, the resolution at the rotation angle α may be reduced to ½ of the resolution at the rotation angle β obtained in the case of disposing the rotation detection sensor on the second rotating axis 411b, so that the precision of measurement may be relatively low. When the rotation detection sensor is disposed on the second rotating axis 411b, there is an advantage in that the resolution is higher than that in the case in which the rotation detection sensor is disposed on the first rotating axis 411a. By disposing the magnet 417 corresponding to the rotation detection sensor in the space of the electronic device 200 expanded as the display is expanded, it is possible to minimize the influence of the magnetic fields from the magnet 417 on the electronic components on the printed circuit boards 261 and 262.

Referring to FIG. 17, the angle between the rotation detection sensor and the magnet is 0 degrees with reference to the slid-in state of the display. In this state, it is possible to perform zero calibration, and then, it is possible to measure a change in the angle between the sensor and the magnet using the rotation detection sensor (e.g., the rotation detection sensor 416 in FIG. 9). The angle between the rotation detection sensor and the magnet may have a maximum value ("Max degrees") with reference to the slid-out state of the display. As a link assembly (e.g., the first link assembly 410) moves until the angle between the rotation detection sensor and the magnet changes from 0 degrees to Max degrees, both the rotation detection sensor and the magnet may form the angle while each rotating about the rotating axis of the link assembly 410. According to an embodiment of the disclosure, the maximum value (mm) of the maximum expanded length of the display may be mapped at the maximum value (Max degrees) of the rotation angle. The angle of Max degrees may be variously set depending on the design of the link assembly 400. According to an embodiment of the disclosure, the angle between the rotation detection sensor and the magnet may be the maximum in the state in which the first arm 411 and the second arm 412 of the link assembly (e.g., the first link assembly 410) are fully unfolded to form an angle of 180 degrees therebetween. At this time, the angle between the rotation detection sensor and the magnet may also have the maximum value (Max degrees) as 180 degrees. It is possible to measure the relative angle change between the rotation detection sensor and the magnet according to the movement of the link assembly (e.g., the first link assembly 410). In the state in which the display is slid-in, the angle between the rotation detection sensor and the magnet may be 0 degrees, and the angle between the rotation detection sensor and the magnet may gradually increase depending on the extent to which the display is expanded. When the display reaches the maximum expanded state (slid-out state), the angle between the rotation detection sensor and the magnet also becomes the maximum as Max degrees.

The display expansion distance varies from 0 mm in the slid-in state of the display to the distance of Max (mm) in the slid-out state of the display (maximum expansion). At this time, the angle between a rotation detection sensor and a magnet mounted on a hinge also changes between 0 degrees and Max degrees. The expansion distance and angle may linearly correspond to each other.

Referring to FIG. 18, the angle between the rotation detection sensor and the magnet may have a linear relationship as illustrated in the drawing. As the angle between the rotation detection sensor and the magnet increases, the expanded distance of the display may also increase. Using this relationship, angle information obtained from the rotation detection sensor may be converted into the expanded distance of the display. According to an embodiment of the disclosure, the angle information obtained from the rotation detection sensor may be converted into the expanded distance of the display, and the processor of the rollable electronic device 200 may determine the expanded distance of the display based on the converted expanded distance value. Through this, it is possible to provide a user interface (UI) optimized for the current screen of the rollable electronic device 200.

According to various embodiments of the disclosure, the rollable electronic device 200 may be divided into a portion on which a screen can be displayed when the display is expanded (e.g., B1 in FIG. 6A or B1 and B2-1 in FIG. 6B) and a portion on which a screen is not displayed when the display is expanded (or the non-used portion) (e.g., B2-2 in FIG. 6B). With the rollable electronic device 200, by accurately measuring the expanded distance during the sliding movement of the display, it is possible to reduce current consumption by turning off the power of the portion on which a screen is not displayed (or the non-used portion), and by adjusting a touch input as well, it is also possible to improve the accuracy of touch recognition.

According to various embodiments of the disclosure, a magnetic measurement sensor is exemplified as a rotation detection sensor, but the scope of various embodiments of the disclosure is not limited thereto. As the rotation detection sensor, in addition to the magnetic measurement sensor, one of an optical type, a power generation type, an electronic type, an oscillation type, and a photoelectric type may be applied.

Various embodiments of the disclosure may provide an electronic device (e.g., the electronic device 200 of FIG. 4), wherein the electronic device includes: a housing (e.g., the housing 200' in FIG. 4) including a first surface oriented in a first direction (e.g., the +Z direction in FIG. 4), a second surface oriented in a second direction (e.g., a direction opposite to the +Z direction of FIG. 4) opposite to the first direction, a first side member (e.g., the first side member 201a of FIG. 4) slidable in a third direction (e.g., the +X direction in FIG. 4) different from the first direction and the second direction, and a second side member (e.g., second side member 202a in FIG. 4) in a direction opposite to the first side member; a flexible display (e.g., the flexible display 203 in FIG. 4) including a first region (e.g., first region B1 in FIG. 4) oriented in the first direction (e.g., the +Z direction in FIG. 4), and a second region (e.g., the second region B2 in FIG. 4) extending from the first region and oriented in the second direction (e.g., the direction opposite to the +Z direction in FIG. 4) opposite to the first direction; a plate (e.g., the first plate 211a in FIG. 4) configured to support at least a portion of the flexible display and to perform a sliding movement to cause at least a portion of the second region to be oriented in the first direction so as to substantially enable expansion of the first region; at least one member (e.g., the roller 300 in FIG. 4 or the link assembly 400 in FIG. 7) configured to enable the sliding movement of the plate (e.g., the first plate 211a in FIG. 4) through a rotational motion; and a rotation detection sensor (e.g., the rotation detection sensor 416 in FIG. 9) configured to detect the degree of rotation while the at least one member rotates about a rotating axis.

According to various embodiments of the disclosure, the at least one member may rotate along at least one rotating axis, and the rotation detection sensor may be disposed on at least one rotating axis (e.g., at least one of the first rotating axis 411*a* in FIG. 14, the second rotating axis 411*b* in FIG. 14, and the third rotating axis 411*c* in FIG. 14).

According to various embodiments of the disclosure, the at least one member may be a link assembly (e.g., the link assembly 400 in FIG. 7) provided to be foldable in an internal space of the housing.

According to various embodiments of the disclosure, the link assembly may support at least a portion of the plate.

According to various embodiments of the disclosure, the electronic device may further include a printed circuit board (e.g., the printed circuit boards 261 and 262 in FIG. 8) accommodated inside the housing and a bracket (e.g., the bracket 270 in FIG. 8) configured to support the printed circuit board, and the link assembly may be disposed between one side of the bracket and the first side member (e.g., the first side member 201*a* in FIG. 8).

According to various embodiments of the disclosure, the link assembly (e.g., the link assembly 400 in FIG. 8) may include a first arm (e.g., the first arm 411 of FIG. 8) rotatably coupled to the bracket and a second arm (e.g., the second arm 412 in FIG. 8) rotatably coupled to the first arm and rotatably coupled to the first side member.

According to various embodiments of the disclosure, the rotation detection sensor may be disposed on a first rotating axis (e.g., the first rotating axis 411*a* in FIG. 14) to which the first arm and the bracket are coupled.

According to various embodiments of the disclosure, the rotation detection sensor may be disposed on a second rotating axis (the second rotating axis 411*b* in FIG. 14) to which the first arm and the second arm are coupled.

According to various embodiments of the disclosure, the rollable electronic device may further include an FPCB (e.g., the FPCB 415 in FIG. 9) coupled to the first arm and configured to electrically connect the rotation detection sensor to a printed circuit board inside the housing.

According to various embodiments of the disclosure, the rotation detection sensor may be disposed on at least one of a first rotating axis to which the first arm and the bracket are coupled, a second rotating axis to which the first arm and the second arm are coupled, and a third shaft to which the second arm and the first side member are coupled.

According to various embodiments of the disclosure, the electronic device may further include a shielding portion configured to shield at least a portion around the rotation detection sensor.

According to various embodiments of the disclosure, the electronic device may further include a spring (e.g., the torsion spring 500 in FIG. 7) having one end and the other end, which are connected to the first arm and the second arm, respectively, wherein the spring includes a winding portion wound around the first rotating axis between the first arm and the second arm.

The winding portion (e.g., the winding portion 501 in FIG. 12) of the spring may be configured to surround a spring guide (e.g., the spring guide 505 in FIG. 12) including a through hole provided therein and disposed on the first rotating axis.

According to various embodiments of the disclosure, the rotation detection sensor may be a sensor of one of a magnetic measurement type, an optical type, a power generation type, an electronic type, an oscillation type, a photoelectric type, and a Hall effect type.

According to various embodiments of the disclosure, the at least one member may be a roller disposed adjacent to the second side member.

Various embodiments of the disclosure may provide an electronic device (e.g., the electronic device 400 in FIG. 4), wherein the electronic device includes: a processor; a first structure (e.g., the first structure 201 in FIG. 4) including a first plate configured to provide a first surface oriented in a first direction and a second surface oriented in a second direction opposite to the first surface; a second structure (e.g., the second structure 202 in FIG. 4) coupled to surround at least a portion of the first structure, and configured to guide the sliding movement of the first structure in a direction parallel to the first surface or the second surface of the first structure; a flexible display (e.g., the flexible display 203 in FIG. 4) including a first region oriented in the first direction and a second region extending from the first region; at least one member disposed inside the housing and configured to rotate according to expansion or contraction of the flexible display (e.g., the roller 300 in FIG. 4 or the link assembly 400 in FIG. 7); and a rotation detection sensor (e.g., the rotation detection sensor 416 in FIG. 9) configured to measure a rotation angle of the at least one member on the rotating axis of the member. The processor is configured to determine the sliding movement distance of the first structure using a change in a detected value measured using the rotation detection sensor on the rotating axis.

According to various embodiments of the disclosure, the at least one member may be a link assembly provided to be foldable in an internal space of the housing.

According to various embodiments of the disclosure, the member may include a first arm and a second arm rotatably coupled to the first arm and rotatably coupled to the first side member.

According to various embodiments of the disclosure, the at least one member may be a roller disposed adjacent to the second side member.

According to various embodiments of the disclosure, the rotation detection sensor may be a sensor of one of a magnetic measurement type, an optical type, a power generation type, an electronic type, an oscillation type, a photoelectric type, and a Hall effect type.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A electronic device comprising:
    a housing including a first housing and a second housing, wherein the first housing is configured to move relative to the second housing;
    a flexible display, wherein an area of the flexible display exposed to an outside of the electronic device is configured to change, between a contracted state and an expanded state, according movement of the first housing;
    a multi-bar plate configured to support at least a portion of the flexible display;
    a link assembly disposed in an inner space of the housing to support at least a portion of the multi-bar plate and including a first arm and a second arm, wherein the second arm is rotatably coupled to the first arm and is rotatably coupled to a portion of the first housing, wherein the link assembly includes a plurality of rotating axes; and a rotation detection sensor disposed on a position corresponding to one of the plurality of rotating axes, and configured to detect a degree of rotation while the first arm rotates about one of the plurality of rotating axes and the second arm rotates about one of the plurality of rotating axes.

2. The electronic device of claim 1, wherein the link assembly is configured to folded or unfolded corresponding to the contracted state or the expanded state respectively.

3. The electronic device of claim 1,
wherein the link assembly is disposed in the inner space of the housing between a first side of the first housing and a bracket of the second housing.

4. The electronic device of claim 3, wherein the plurality of rotating axes includes a first rotating axis, a second rotating axis and a third rotating axis,
wherein the first rotating axis is an axis to which the first arm and the bracket are coupled,
wherein the second rotating axis is an axis to which the first arm and the second arm are coupled, and
wherein the third rotating axis is an axis to which the second arm and a first side member of the housing are coupled.

5. The electronic device of claim 4, wherein the rotation detection sensor is disposed on the first rotating axis.

6. The electronic device of claim 4, wherein the rotation detection sensor is disposed on the second rotating axis.

7. The electronic device of claim 1, further comprising:
a flexible printed circuit board (FPCB) disposed on the first arm and configured to electrically connect the rotation detection sensor to a printed circuit board inside the housing.

8. The electronic device of claim 1, further comprising:
a shielding portion configured to shield at least a portion around the rotation detection sensor.

9. The electronic device of claim 1, further comprising:
a spring having one end and another end connected to the first arm and the second arm respectively, wherein the spring includes a winding portion wound around the first rotating axis between the first arm and the second arm.

10. The electronic device of claim 9, wherein the winding portion of the spring surrounds a spring guide including a through hole provided therein and disposed on the first rotating axis.

11. The electronic device of claim 1, wherein the rotation detection sensor is a sensor of one of a magnetic measurement type, an optical type, a power generation type, an electronic type, an oscillation type, and a photoelectric type.

12. The electronic device of claim 1,
wherein the second housing is coupled to enclose at least a part of the first housing, and is configured to guide a movement of the first housing.

13. The electronic device of claim 1, further comprising:
a processor; and
memory storing instructions that, when executed by the processor, cause the electronic device to identify a movement distance of the first housing using a change in a detected value through the rotation detection sensor.

* * * * *